(12) United States Patent
Yen et al.

(10) Patent No.: US 10,978,312 B2
(45) Date of Patent: Apr. 13, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW); Kay Stefan Essig, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 34 days.

(21) Appl. No.: 16/403,393

(22) Filed: May 3, 2019

(65) Prior Publication Data
US 2020/0350180 A1 Nov. 5, 2020

(51) Int. Cl.
| | | |
|---|---|---|
| *H01L 21/48* | (2006.01) | |
| *H01L 23/495* | (2006.01) | |
| *H01L 23/552* | (2006.01) | |
| *H01L 21/56* | (2006.01) | |
| *H01Q 1/22* | (2006.01) | |

(Continued)

(52) U.S. Cl.
CPC ...... *H01L 21/4825* (2013.01); *H01L 21/4828* (2013.01); *H01L 21/56* (2013.01); *H01L 23/49517* (2013.01); *H01L 23/49575* (2013.01); *H01L 23/552* (2013.01); *H01Q 1/2283* (2013.01); *H01Q 1/526* (2013.01);
(Continued)

(58) Field of Classification Search
CPC ....... H01L 2924/00; H01L 2224/73265; H01L 2224/97; H01L 2224/32145; H01L 2224/48227; H01L 2924/12042; H01L 2924/15787; H01L 2924/181; H01L 2924/3011; H01L 2224/81; H01L 2924/00012; H01L 2223/6677; H01L 2224/16225; H01L 2224/48091; H01L 23/66; H01L 25/16; H01L 21/4853; H01L 21/4857; H01L 21/486; H01L 21/56; H01L 21/561; H01L 21/565; H01L 21/568; H01L 21/78; H01L 2223/6616; H01L 2223/6683; H01L 2224/0401; H01L 2224/04105; H01L 23/3142; H01L 23/49822; H01L 23/49827; H01L 23/49838; H01L 23/5226; H01L 23/5389; H01L 24/19; H01L 24/73; H01L 24/96; H01L 24/97; H01L 25/0657; H01L 2924/00014; H01L 2924/01029; H01L 25/00; H01L 2924/1815
See application file for complete search history.

(56) References Cited

U.S. PATENT DOCUMENTS

| | | | |
|---|---|---|---|
| 9,496,219 B2 | 11/2016 | Yoo et al. | |
| 2017/0018513 A1* | 1/2017 | Yoo | ........................ H01L 24/19 |

FOREIGN PATENT DOCUMENTS

| | | |
|---|---|---|
| CN | 1180512 C | 12/2004 |
| KR | 10-1151254 B1 | 6/2012 |

* cited by examiner

*Primary Examiner* — Monica C King
(74) *Attorney, Agent, or Firm* — Foley & Lardner LLP

(57) ABSTRACT

At least some embodiments of the present disclosure relate to a semiconductor device package. The semiconductor device package includes a carrier having a first surface and a second surface opposite to the first surface, an encapsulant, and an antenna. The encapsulant is disposed on the first surface of the carrier. The antenna is disposed on the encapsulant. The antenna includes a seed layer and a conductive layer.

45 Claims, 55 Drawing Sheets

(51) Int. Cl.
 *H01Q 1/52* (2006.01)
 *H01L 25/18* (2006.01)
 *H01L 25/04* (2014.01)
 *H01L 25/16* (2006.01)
(52) U.S. Cl.
 CPC .............. *H01L 25/04* (2013.01); *H01L 25/16* (2013.01); *H01L 25/18* (2013.01)

SEMICONDUCTOR DEVICE PACKAGE AND METHOD OF MANUFACTURING THE SAME

BACKGROUND

1. Technical Field

The present disclosure relates to a semiconductor device package comprising an antenna including a seed layer and a conductive layer.

2. Description of the Related Art

Antennas are formed by an electrical plating operation and disposed on an upper surface of a molding compound of an IC package. During the electrical plating operation, a backside of a substrate may be protected by an adhesive layer so as to avoid conductive materials being plated on the backside of the substrate. However, the residual of the adhesive may remain on the backside of the substrate after a removing operation.

The substrate may be replaced with a metal frame. However, the metal frame may be easily deformed during a heating operation.

A shielding layer may be included in a semiconductor package to shield an integrated circuit within the semiconductor package from electromagnetic interference. Instead of a shielding layer, an antenna may be included. In another case, both antenna and shielding layers may be included. The thickness of the shielding layer can be dependent on whether the shielding layer is intended to block electromagnetic interference signals with high frequency or low frequency. The high frequency refers to 0.5 GHz to 6 GHz, and the low frequency refers to 10 MHz to 100 MHz. For example, in order to achieve effects of shielding, the thickness of the shielding layer for blocking electromagnetic interference (EMI) with relatively low frequency can be thicker than the thickness of the shielding layer for blocking electromagnetic interference with relatively high frequency due to tunneling effects of low frequency signals. However, if the shielding layer with a greater thickness is formed by a sputtering operation, higher costs and longer manufacturing time, thus lower production throughput, may be incurred.

SUMMARY

In some embodiments, according to one aspect of the present disclosure, a semiconductor device package includes a carrier having a first surface and a second surface opposite to the first surface, an encapsulant, and an antenna. The encapsulant is disposed on the first surface of the carrier. The antenna is disposed on the encapsulant. The antenna includes a seed layer and a conductive layer.

In some embodiments, according to one aspect of the present disclosure, a semiconductor device package includes a carrier having a first surface and a second surface opposite to the first surface, an encapsulant, and an antenna. The carrier includes a first layer proximal to the first surface and a second layer proximal to the second surface. The second layer includes a bi-layer. The encapsulant is disposed on the first surface of the carrier. The antenna is disposed on the encapsulant. The antenna including a seed layer and a conductive layer. A material of one of the seed layer and the conductive layer of the antenna is the same as a material of one of the bi-layer of the second layer.

In some embodiments, according to another aspect of the present disclosure, a method is disclosed for manufacturing a semiconductor device package. The method includes: providing a carrier including a first patterned layer proximal to a first surface of the carrier; encapsulating the carrier by an encapsulant; forming trenches in the encapsulant; forming a conductive layer in the trenches and on the carrier and, subsequent to forming the conductive layer in the trenches and on the carrier, forming a second patterned layer proximal to a second surface of the carrier, the second surface being opposite to the first surface.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
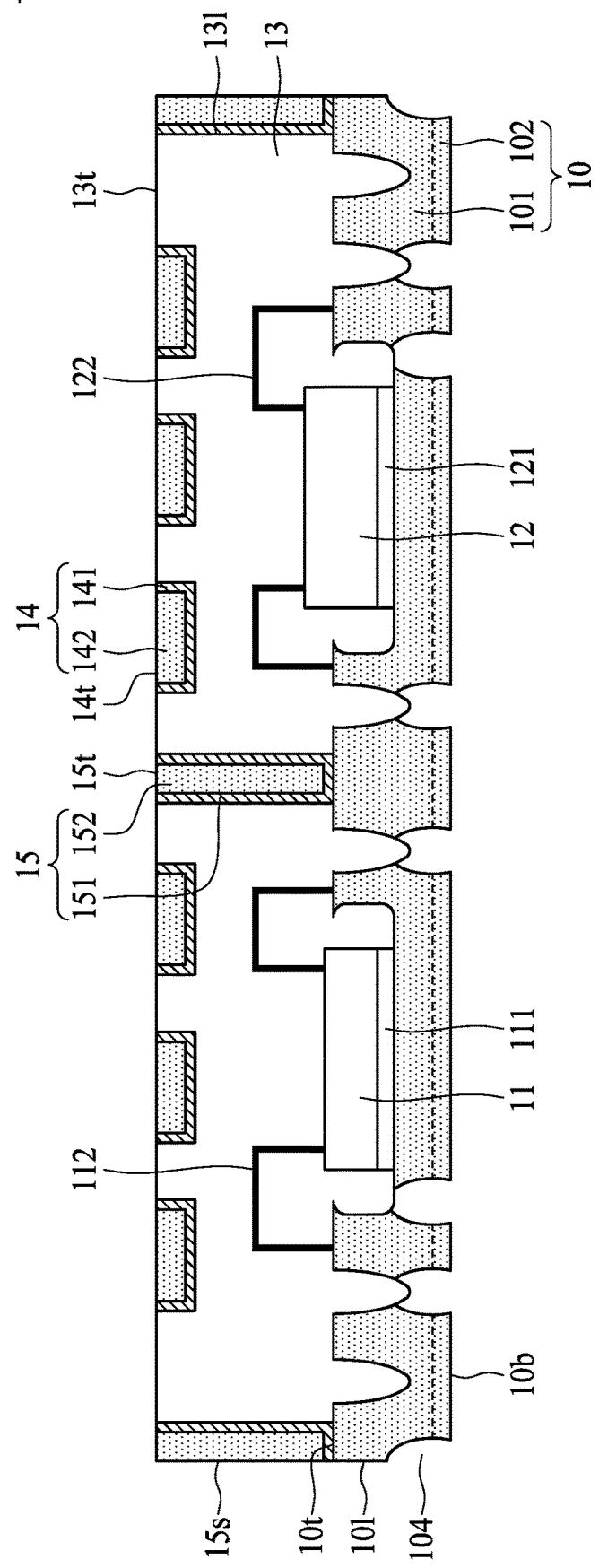
FIG. 1A illustrates a cross-sectional view of a semiconductor device package according to some embodiments of the present disclosure.

Common reference numerals are used throughout the drawings and the detailed description to indicate the same or similar components.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-sectional view of a semiconductor device package 1 in accordance with some embodiments of the present disclosure. The semiconductor device package 1 includes a carrier 10, semiconductor devices 11 and 12, an encapsulant 13, an antenna 14, and a shielding layer 15.

In some embodiments, the carrier 10 has a top surface 10t and a bottom surface 10b opposite to the top surface 10t. The carrier 10 has a lateral surface 10l between the top surface 10t and the bottom surface 10b. The carrier 10 has a layer 102 proximal to the top surface 10t and a layer 101 proximal to the bottom surface 10b. In some embodiments, the layer 102 can be a conductive layer 102, and the layer 101 can be a conductive layer 101. In some embodiments, the carrier 10 may include a lead frame or a quad flat no-lead (QFN) structure. In some embodiments, the layer 102 proximal to the top surface 10t may include a lead frame or a quad flat no-lead (QFN) structure. During plating operations, organic carrier counterpart may specify extra adhesive or protection layer at its back surface in order to prevent the solder bump or solder ball, which situated at the back surface, from being plated during the aforesaid operation. In the event of incomplete removal of the adhesive or protection layer from the back side of the organic carrier counterpart, residual adhesive may be carried to subsequent operations. On the other hand, application of an adhesive to the backside of the QFN structure may be omitted during plating operations, and hence, the problem of residual adhesive may be effectively avoided. In some embodiments, the material content of the conductive layer 101 can be different from that of the conductive layer 102. For example, a conductive substance, for example, copper (Cu), in the conductive layer 102 can be greater in content than the same conductive substance in the conductive layer 101. The conductive layers 101 and 102 may be patterned to form two patterned conductive layers. As shown in FIG. 1A, the conductive layer 101 is in contact with the conductive layer 102. A boundary between the conductive layer 101 and conductive layer 102 may be identified. In some embodiments, the conductive layer 101 may include a copper (Cu) alloy or other suitable materials. The conductive layer 102 may include Cu or other suitable materials.

As exemplified in FIG. 1A, the carrier 10 may include a recess 104 adjacent to a periphery of the bottom surface 10b of the carrier 10. The recess 104 provides a space for bleeding of solder (e.g., SnPb). The carrier 10 may be solidly jointed to a printed circuit board (PCB). The recess 104 of the carrier 10 may function as a wettable flank for electronic devices for vehicle applications.

The semiconductor device 11 is disposed on the top surface 10t of the carrier 10. The semiconductor device 11 may be wire-bonded to the carrier 10 through a conductive wire 112. An adhesive 111 is disposed between the carrier 10 and the semiconductor device 11. In some embodiments, the semiconductor device 11 may be a flip-chip bonded to the carrier 10. The semiconductor device 11 may include an application-specific integrated circuit (ASIC), a controller, a processor or other electronic component or semiconductor device.

Similarly, the semiconductor device 12 may be wire-bonded to the carrier 10 through a conductive wire 122. An adhesive 121 is disposed between the carrier 10 and the semiconductor device 12. The arrangement of the semiconductor device 12 is similar to that of the semiconductor device 11. The semiconductor device 12 may be substantially the same as or different from the semiconductor device 11.

The encapsulant 13 is disposed on the top surface 10t of the carrier 10. The encapsulant 13 encapsulates the carrier 10. The encapsulant 13 encapsulates the top surface 10t of the carrier 10. The encapsulant 13 encapsulates the semiconductor devices 11 and 12. The encapsulant 13 has a top surface 13t and a lateral surface 13l substantially perpendicular to the top surface 13t. The encapsulant 13 has a trench to accommodate the antenna 14. The encapsulant 13 further has an additional trench to accommodate the shielding layer 15. The encapsulant 13 may be exposed by an opening of the carrier 10. The encapsulant 13 may be exposed by the bottom surface 10b of the carrier 10.

The antenna 14 is disposed on the top surface 13t of the encapsulant 13. The antenna 14 is disposed in the trench of the encapsulant 13. The antenna 14 is embedded in the encapsulant 13. The antenna 14 has a top surface 14t exposed from the encapsulant 13. The top surface 14t of the antenna 14 is coplanar with the top surface 13t of the encapsulant 13. The antenna 14 is encapsulated, at least laterally, by the encapsulant 13.

The antenna 14 may include a seed layer 141 and a conductive layer 142. The seed layer 141 may include Ti, TiCu or other suitable materials. The seed layer 141 may include a magnetic material such as Ni, Fe, or stainless steel.

The seed layer 141 may include materials with high magnetic conductivity. The conductive layer 142 may include Cu or other suitable materials. The conductive layer 142 may be separated or spaced from the encapsulant 13 by the seed layer 141. The conductive layer 142 is surrounded by the seed layer 141 from sidewalls and bottom. In some embodiments, an appearance or a shape of the antenna may be changed according to desired applications.

The shielding layer 15 can be disposed on the top surface 10t of the carrier 10. The shielding layer 15 may be disposed in an additional trench of the encapsulant 13. The shielding layer 15 is encapsulated by the encapsulant 13. The shielding layer 15 has a top surface 15t and a side surface 15s substantially perpendicular to the top surface 15t. The top surface 15t of the shielding layer 15 is coplanar with the top surface 13t of the encapsulant 13 and exposed from the encapsulant 13. The side surface 15s of the shielding layer 15 is coplanar with the lateral surface 10l of the carrier 10. The shielding layer 15 is in contact with the lateral surface 13l of the encapsulant 13. The shielding layer 15 may surround the antenna pattern of each compartment. As shown in FIG. 1A, semiconductor device 11 can be in a left compartment defined by the shielding layer 15, whereas semiconductor device 12 can be in a right compartment defined by the shielding layer 15. The shielding layer 15 surrounds the encapsulant 13. The shielding layer 15 is separated or spaced from the antenna 14 by the encapsulant 13.

The shielding layer 15 includes a seed layer 151 and a conductive layer 152. The seed layer 151 may include Ti, TiCu or other suitable materials. The seed layer 151 may include a magnetic material such as Ni, Fe, or stainless steel. The seed layer 151 may include materials with high magnetic conductivity. The conductive layer 152 may include Cu or other suitable materials. The conductive layer 152 is separated or spaced from the encapsulant 13 by the seed layer 151.

Figure 1B:
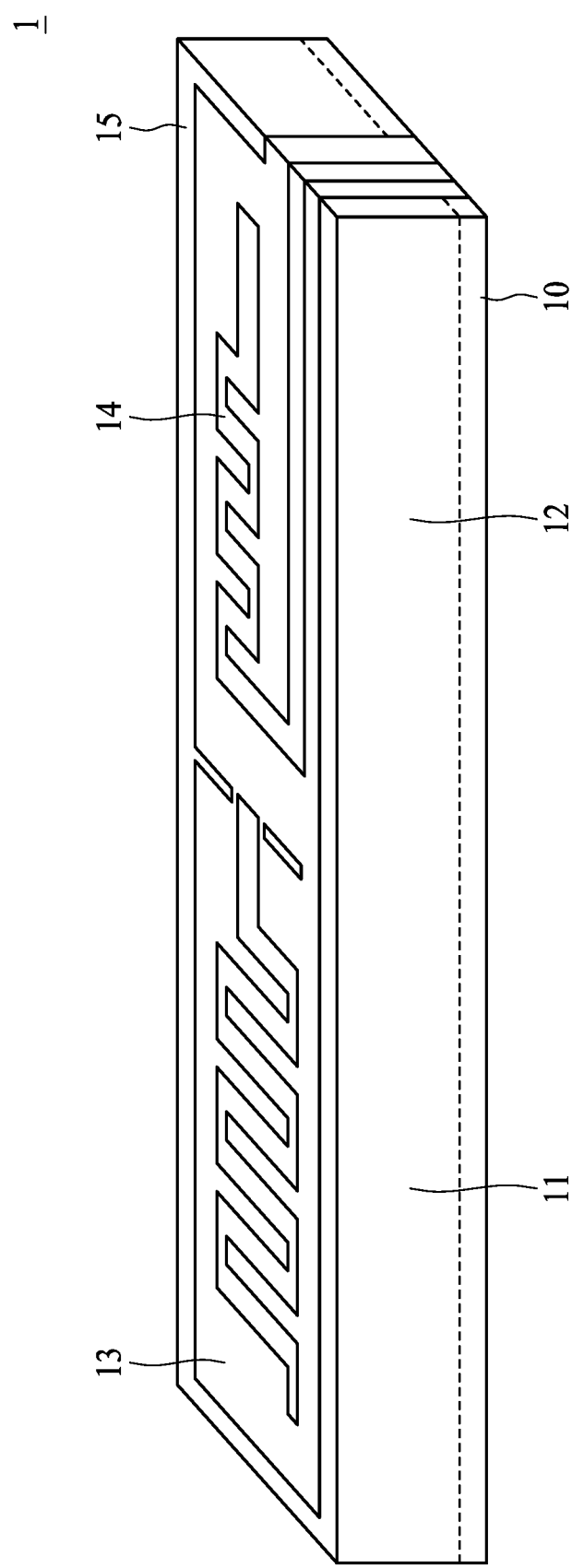
FIG. 1B illustrates a perspective view of a semiconductor device package according to some embodiments of the present disclosure.

FIG. 1B is a cross-sectional view of a semiconductor device package 1 in accordance with some embodiments of the present disclosure. The shielding layer 15 surrounds the carrier 10. The shielding layer 15 surrounds the semiconductor devices 11 and 12 (not shown in FIG. 1B). The shielding layer 15 surrounds the encapsulant 13. The shielding layer 15 surrounds the antenna 14. The shielding layer 15 surrounds the antenna 14 in a manner which may prevent electromagnetic interference (EMI) from broader frequency ranges including low frequency EMI. It is understood that, compared to the higher frequency EMI counterpart, lower frequency EMI possesses longer wavelength, and hence a thicker shielding layer may be specified to effectively filter out the low frequency EMI. Thickness of the shielding layer 15 may be controlled by the manufacturing operation provided in the present disclosure. Suitable thickness of the shielding layer 15 can be achieved by electroplating operations, as in some embodiments introduced in the present disclosure. Various sputtering operations can also be applied to form the shielding layer 15. In some embodiments, electroplating operations may possess throughput and cost benefit as far as both operations are concerned.

A side surface of one terminal of the shielding layer 15 may be substantially coplanar with a side surface of one terminal of the encapsulant 13. A side surface of one terminal of the shielding layer 15 may be substantially coplanar with a side surface of one terminal of the antenna 14.

Figure 1C:
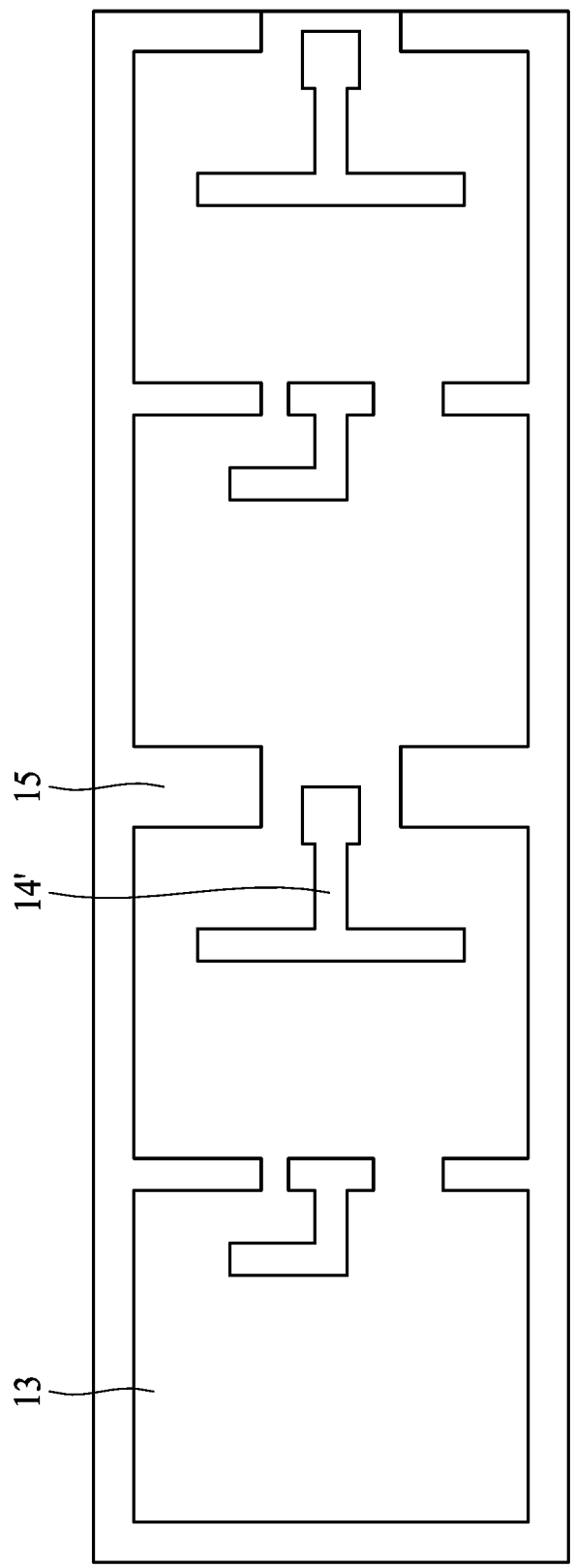
FIG. 1C illustrates a top view of a semiconductor device package according to some embodiments of the present disclosure.

FIG. 1C is a top view of a semiconductor device package 1' in accordance with some embodiments of the present disclosure. The semiconductor device package 1' is similar to the semiconductor device package 1 in FIG. 1B except that an appearance or a shape of an antenna 14' is different from that of the antenna 14 and that surfaces of the antenna 14' are surrounded by the encapsulant 13, for example, form various lateral sides.

Figure 1D:
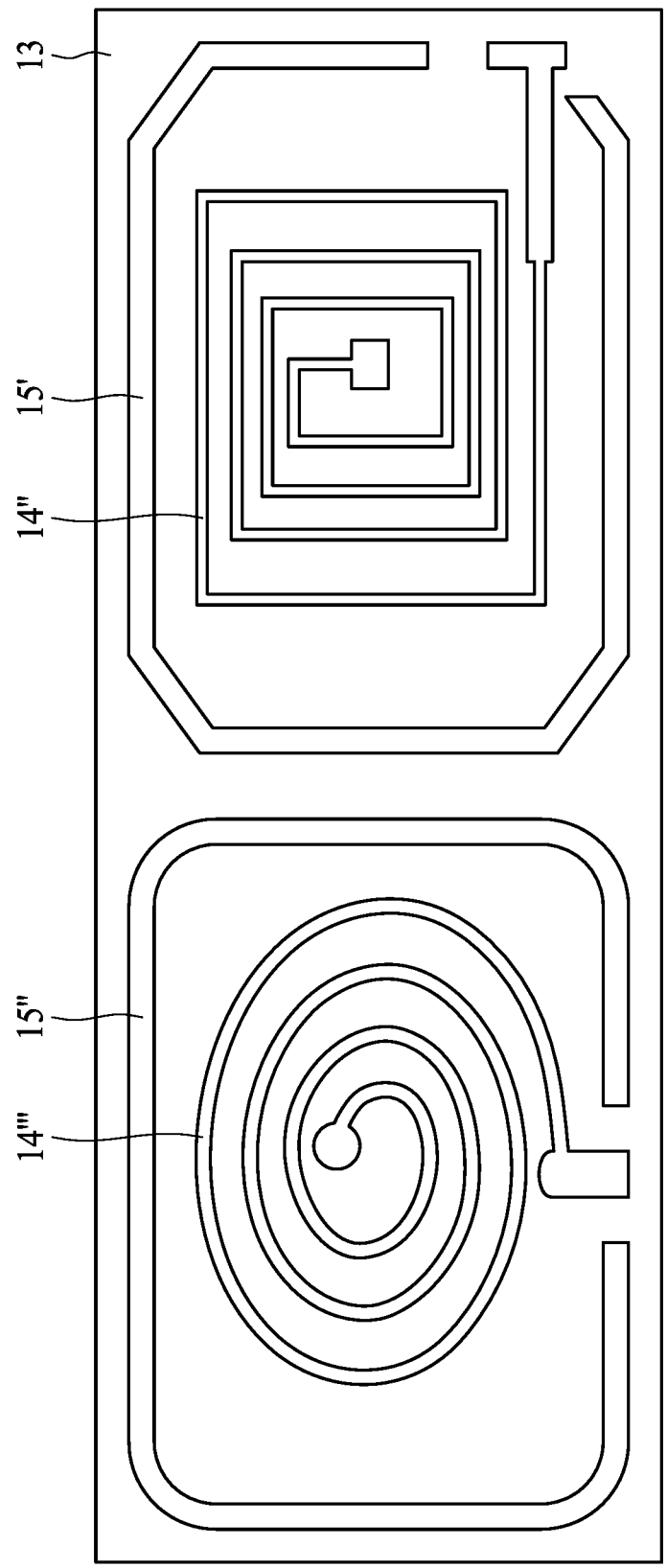
FIG. 1D illustrates a top view of a semiconductor device package according to some embodiments of the present disclosure.

FIG. 1D is a cross-sectional view of a semiconductor device package 1" in accordance with some embodiments of the present disclosure. The semiconductor device package 1" is similar to the semiconductor device package 1 in FIG. 1C except that a pattern of an antenna 14" or antenna 14''' is different from that of the antenna 14' and that shielding layers 15' and 15" are embedded in the encapsulant 13, for example, from various lateral sides. The shielding layer 15' surrounds the antenna 14". The shielding layer 15" surrounds the antenna 14'''. In some embodiments, the pattern of the antenna 14" is different from that of the antenna 14'''. That is, two different antennas or patterns of antennas may be implemented in two adjacent compartments or any two compartments of the semiconductor device package. In some embodiments, one compartment with the antenna and the other without antenna may be implemented. More than two compartments may be implemented. The compartments may have different shapes to match designs, such as triangular, curved, trapezoidal, or other irregular shapes, etc.

Apart from the configuration of the shielding layers 15, 15', 15", the shielding layer may fully cover the underlying semiconductor die from a top view perspective. Alternatively stated, the shielding layer may cover one of the compartments from a top view perspective. Since the shielding layer may be electrically connected to the carrier 10 through the lateral sides that exemplified in FIG. 1A and FIG. 1B, in the instance where the shielding layer fully covers the corresponding compartment, the shielding layer can also function as a heat spreader or a heat sink. In some other embodiments, the shielding layer may possess a fence- or net-configuration from a top view perspective. The fence- or net-configuration may possess manufacturing benefit when a grinding or planarization operation is performed to remove excess shielding materials from the top of the compartment.

Figure 2A:
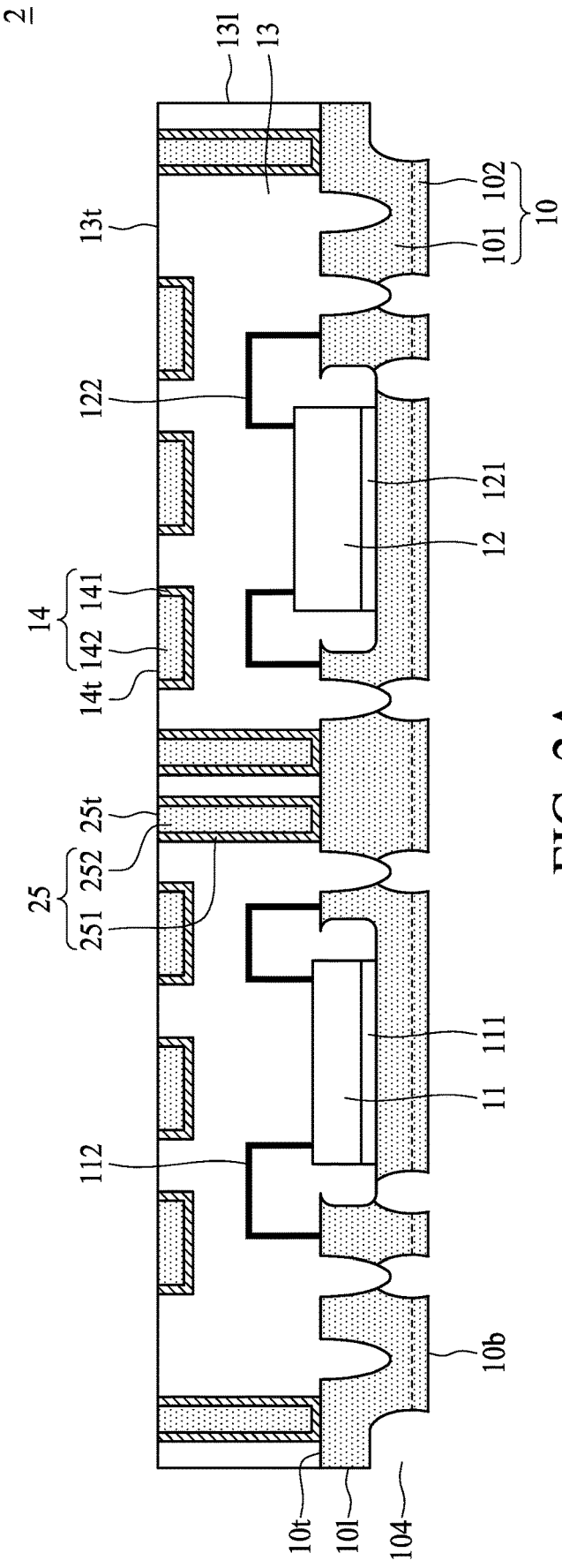
FIG. 2A illustrates a cross-sectional view of a semiconductor device package according to some embodiments of the present disclosure.

FIG. 2A is a cross-sectional view of a semiconductor device package 2 in accordance with some embodiments of the present disclosure. The semiconductor device package 2 can be similar to the semiconductor device package 1 in FIG. 1A except that a shielding layer 25 can be laterally surrounded by the encapsulant 13. Alternatively stated, the shielding layer 25 is embedded in the encapsulant 13. In some embodiments, the lateral surface 13l of the encapsulant 13 may be substantially coplanar with the lateral surface 10l of the carrier 10. The shielding layer 25 can be encapsulated by the encapsulant 13. In some embodiments, the encapsulant 13 may cover the lateral surface 10l of the carrier 10 (not shown in FIG .2A). As shown in FIG. 2A, the two compartment can be subsequently separated or sawed by a laser-sawing operation. The laser can be focused on the portion of encapsulant 13 between adjacent shielding layers 25 when performing the laser-sawing operation, and after the operation, the shielding layer 25 of individual separated package can be laterally covered by the encapsulant 13. In some other embodiments, a roller blade can be implemented to individually, or combine with the laser blade, perform the aforesaid separation or sawing operation. In some embodiments, the lateral pitch of the adjacent shielding layer 25 can be designed to fit the dimension of the laser blade and/or the roller blade.

The shielding layer 25 includes a seed layer 251 and a conductive layer 252. The seed layer 251 may include Ti, TiCu or other suitable materials. The seed layer 251 may include a magnetic material such as Ni, Fe, or stainless steel. The seed layer 251 may include materials with high magnetic conductivity. The conductive layer 252 may include Cu or other suitable materials. The conductive layer 252 is separated from the encapsulant 13 by the seed layer 251. The conductive layer 252 is surrounded by the seed layer 251.

Figure 2B:
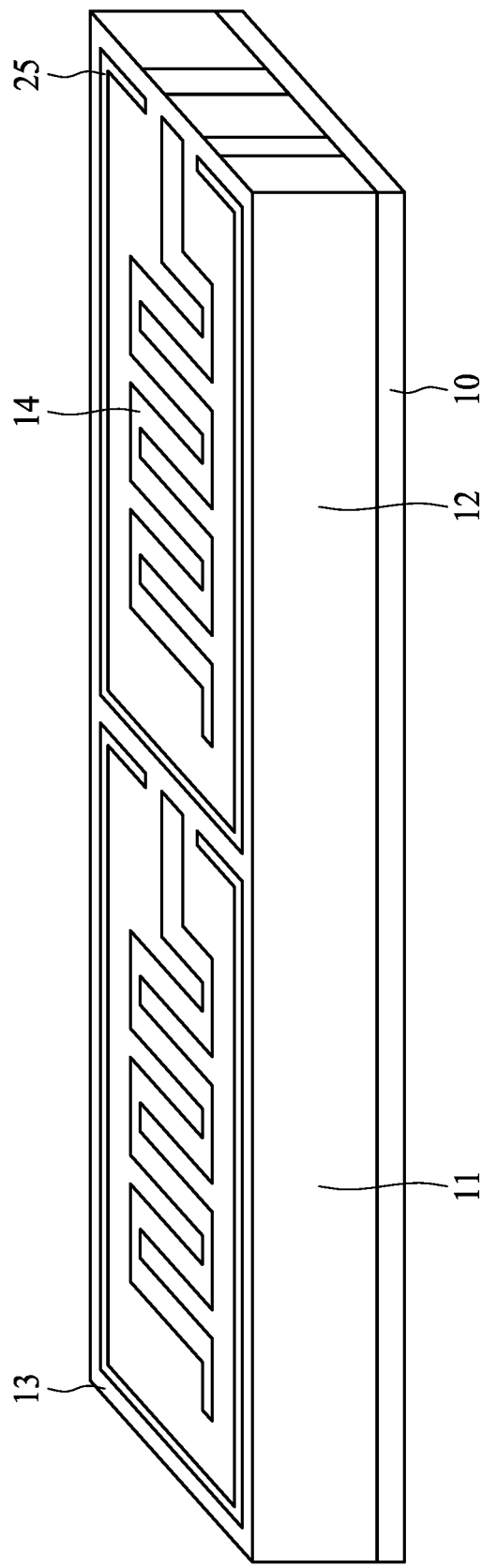
FIG. 2B illustrates a perspective view of a semiconductor device package according to some embodiments of the present disclosure.

FIG. 2B is a perspective view of a semiconductor device package 2 in accordance with some embodiments of the present disclosure. The shielding layer 25 surrounds the semiconductor devices 11 and 12 (not shown in FIG. 2B). The shielding layer 25 surrounds the antenna 14. The encapsulant 13 surrounds the shielding layer 25. The shielding layer 25 may surround the antenna pattern of each compartment. As shown in FIG. 2A, semiconductor device 11 can be in a left compartment defined by the shielding layer 25, whereas semiconductor device 12 can be in a right compartment defined by the shielding layer 25. The shielding layer 25 surrounds the encapsulant 13. The shielding layer 25 is separated or spaced from the antenna 14 by the encapsulant 13.

Figure 3:
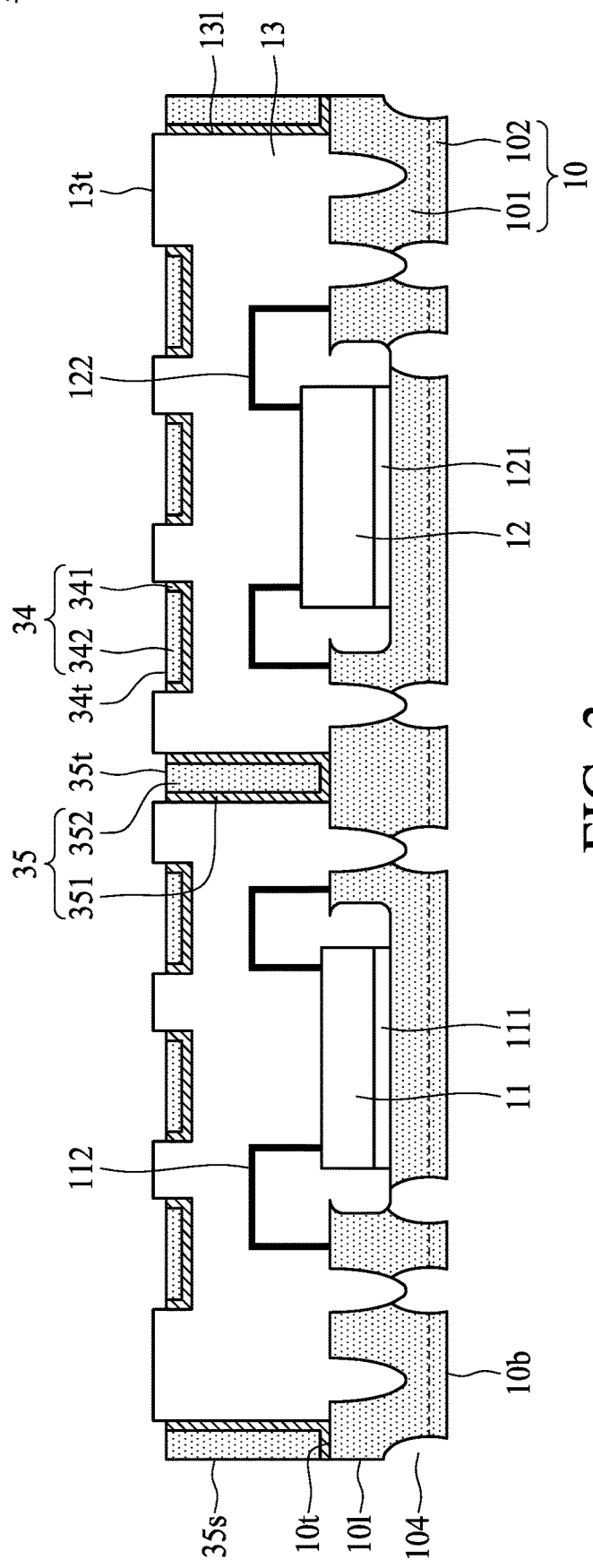
FIG. 3 illustrates a cross-sectional view of a semiconductor device package according to some embodiments of the present disclosure.

FIG. 3 is a cross-sectional view of a semiconductor device package 3 in accordance with some embodiments of the present disclosure. The semiconductor device package 3 is similar to the semiconductor device package 1 in FIG. 1A except that a top surface 34t of an antenna 34 and a top surface 35t of a shielding layer 35 are lower than the top surface 13t of the encapsulant 13. A side surface of the shielding layer 35 is substantially coplanar with the lateral surface 13l of the encapsulant 13. Such configuration of the antenna 34 and the shielding layer 35 may allow the top surface 34t of the antenna 34 to recess from the top surface 13t of the encapsulant 13 and further prevent the top surface 34t of the antenna 34 from being scratched during manufacturing operation, handling operation, or an operation for attaching the semiconductor device package 3 to a PCB, etc.

The antenna 34 has a seed layer 341 and a conductive layer 342. The seed layer 341 may include Ti, TiCu or other suitable materials. The seed layer 341 may include a magnetic material such as Ni, Fe, or stainless steel. The seed layer 341 may include materials with high magnetic conductivity. The conductive layer 342 may include Cu or other suitable materials. The conductive layer 342 is separated from the encapsulant 13 by the seed layer 341. The conductive layer 342 is surrounded by the seed layer 341. In some embodiments, a pattern of the antenna may be changed based on specific applications.

The shielding layer 35 includes a seed layer 351 and a conductive layer 352. The seed layer 351 may include Ti, TiCu or other suitable materials. The seed layer 351 may include a magnetic material such as Ni, Fe, or stainless steel. The seed layer 351 may include materials with high magnetic conductivity. The conductive layer 352 may include Cu or other suitable materials. The conductive layer 352 can be separated from the encapsulant 13 by the seed layer 351.

Figure 4:
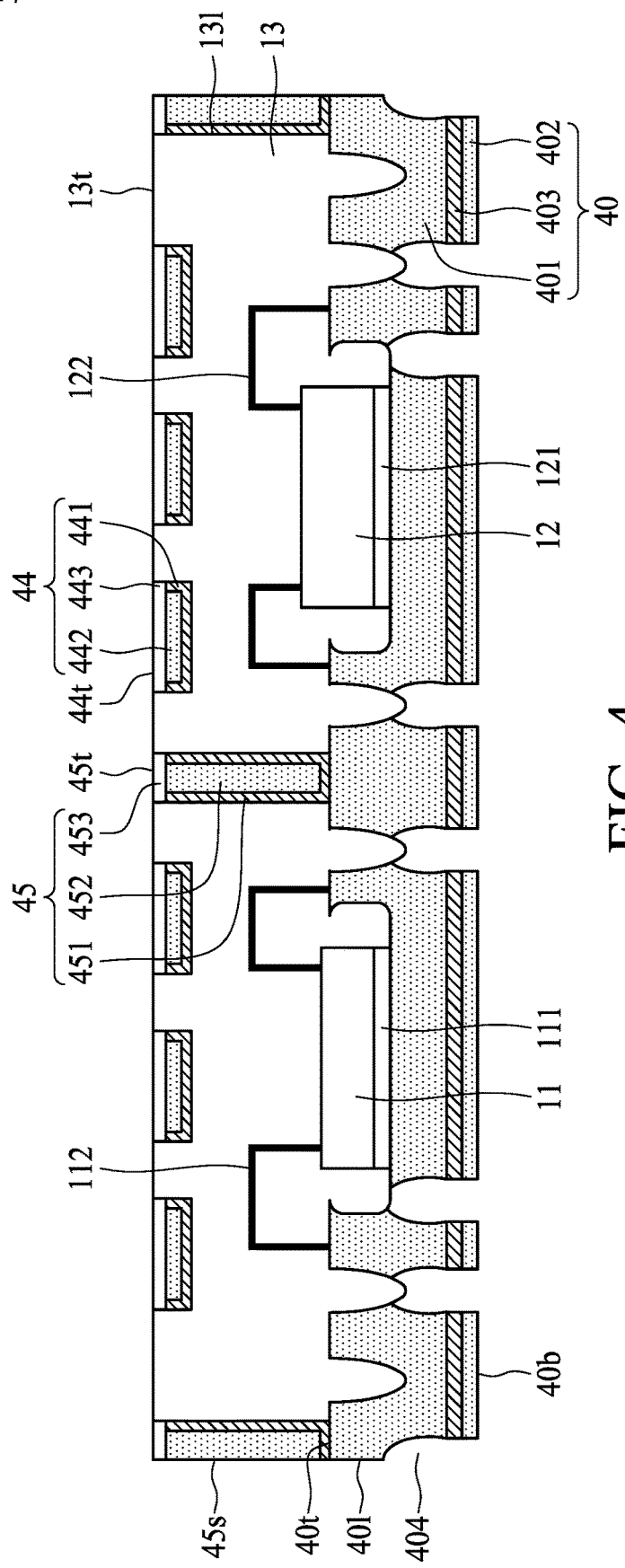
FIG. 4 illustrates a cross-sectional view of a semiconductor device package according to some embodiments of the present disclosure.

FIG. 4 is a cross-sectional view of a semiconductor device package 4 in accordance with some embodiments of the present disclosure. The semiconductor device package 4 is similar to the semiconductor device package 1 in FIG. 1A except that a carrier 40 can be a tri-layer structure, an antenna 44 can be a tri-layer structure, and a shielding layer 45 can be a tri-layer structure.

The carrier 40 has a top surface 40t and a bottom surface 40b opposite to the top surface 40t. The carrier 40 has a lateral surface 40l between the top surface 40t and the bottom surface 40b. The carrier 40 may have a conductive layer 401 proximal to the top surface 40t, a conductive layer 402 proximal to the bottom surface 40b, and a seed layer 403 between the conductive layer 401 and conductive layer 402. In some embodiments, the conductive layer 402 and the seed layer 403 form a bi-layer in contact with the conductive layer 401. In some embodiments, the conductive layers 401 and 402 and the seed layer 403 form a tri-layer. The materials of conductive layers 401 and 402 and the seed layer 403 can be different from one another. The conductive layer 401 is in contact with the seed layer 403. The seed layer 403 is in contact with the conductive layer 402. In some embodiments, the conductive layer 401 may include a copper (Cu) alloy or other suitable materials. The conductive layer 402 may include Cu or other suitable materials. The seed layer 403 may include Ti, TiCu or other suitable materials. The seed layer 403 may include a magnetic material such as Ni, Fe, or stainless steel. The seed layer 403 may include materials with high magnetic conductivity. The carrier 40 may be, for example, a lead frame. The carrier 40 may include a quad flat no lead (QFN) structure. A conductive substance, for example, copper (Cu), in the conductive layer 402 can be greater in content than the conductive substance in the conductive layer 401. For example, the conductive layer 401 may be a QFN structure including Cu alloy, and the conductive layer 401 may be a Cu layer formed by electroplating and/or sputtering operations.

The carrier 40 may possess a recess 404 adjacent to a periphery of the bottom surface 40b of the carrier 40. The recess 404 provides a space for bleeding of solder (e.g., SnPb). The carrier 40 may be solidly jointed to a printed circuit board (PCB). The recess 404 may function as a wettable flank for vehicle electronic devices. In some embodiments, when solder is wetted at the recess 404 of the carrier 40 and joining the carrier 40 to a PCB, periphery of the solder can be observed when inspecting the semiconductor device package 4 from a top view perspective.

The antenna 44 is disposed on the top surface 13t of the encapsulant 13. The antenna 44 is disposed in the trench of the encapsulant 13. The antenna 44 is embedded in the encapsulant 13. The antenna 44 has a top surface 44t. The top surface 44t of the antenna 44 is coplanar with the top surface 13t of the encapsulant 13. The antenna 44 is encapsulated by the encapsulant 13. The antenna 44 is exposed from the encapsulant 13.

The antenna 44 may include a seed layer 441, a conductive layer 442, and a protection layer 443. The seed layer 441 may include Ti, TiCu or other suitable materials. The seed layer 441 may include a magnetic material such as Ni, Fe, or stainless steel. The seed layer 441 may include materials with high magnetic conductivity. The conductive layer 442 may include Cu or other suitable materials. The conductive layer 442 is separated or spaced from the encapsulant 13 by the seed layer 441. The conductive layer 442 is surrounded, from lateral sides and from bottom, by the seed layer 441. The protection layer 443 covers the seed layer 441 and the conductive layer 442. The protection layer 443 is proximal to the top surface 44t of the antenna 44. The protection layer 443 may be an isolation layer or a conductive layer. The protection layer 443 may prevent the conductive layer 442 from oxidation or being scratch during subsequent manufacturing or handling processes. In some embodiments, the protection layer 443 may include insulated materials such as a solder mask layer, conductive materials such as surface finishing or anti-corrosive material, or other suitable materials. In some embodiments, the protection layer 443 may include Ni, Au, Pd, their respective alloys, or other suitable materials. In some embodiments, the pattern of the antenna may be changed based on specific applications.

The shielding layer 45 is disposed on the top surface 40t of the carrier 40. The shielding layer 45 is disposed in the additional trench of the encapsulant 13. The shielding layer 45 is encapsulated by the encapsulant 13. The shielding layer 45 has a top surface 45t and a side surface 45s substantially perpendicular to the top surface 45t. The top surface 45t of the shielding layer 45 is coplanar with the top surface 13t of the encapsulant 13. The side surface 45s of the shielding layer 45 is coplanar with the lateral surface 40l of the carrier 40. The shielding layer 45 is in contact with the lateral surface 13l of the encapsulant 13. The shielding layer 45 surrounds the antenna 44. The shielding layer 45 surrounds the encapsulant 13. The shielding layer 45 is separated from the antenna 44 by the encapsulant 13.

The shielding layer 45 may include a seed layer 451, a conductive layer 452, and a protection layer 453. The seed layer 451 may include Ti, TiCu or other suitable materials. The seed layer 451 may include a magnetic material such as Ni, Fe, or stainless steel. The seed layer 451 may include materials with high magnetic conductivity. The conductive layer 452 may include Cu or other suitable materials. The conductive layer 452 is separated or spaced from the encapsulant 13 by the seed layer 451. The protection layer 453 covers the seed layer 451 and the conductive layer 452. The protection layer 453 is proximal to the top surface 45t of the shielding layer 45. The protection layer 453 may be an isolation layer or a conductive layer. The protection layer 453 may prevent the conductive layer 452 from oxidation or being scratch during subsequent manufacturing or handling processes. In some embodiments, the protection layer 453 may include insulated materials such as a solder mask layer, conductive materials such as surface finishing or anti-corrosive material, or other suitable materials. In some embodiments, the protection layer 453 may include Ni, Au, Pd, their respective alloys, or other suitable materials.

In some embodiments, with suitable manufacturing adjustment, the top surface 13t of the encapsulant 13 may be higher than the top surface 44t of the antenna 44 and the top surface 45t of the shielding layer 45.

FIG. 5A through FIG. 5H illustrate some embodiments of a method of manufacturing the semiconductor device package 1 according to some embodiments of the present disclosure. Various figures have been simplified to more clearly present aspects of the present disclosure. The operations of the method of manufacturing the semiconductor device package 1 may be similarly applied to the semiconductor device packages of FIGS. 1B, 1C, 1D, 3, and 4.

Figure 5A:
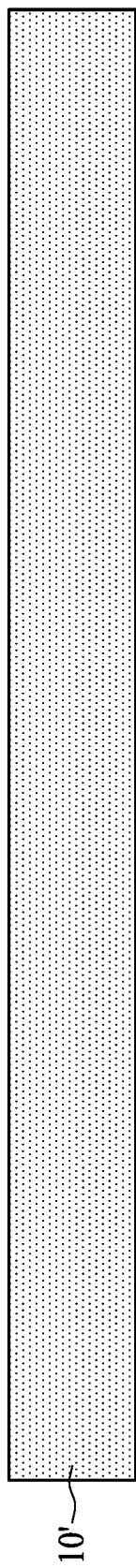
FIG. 5A, FIG. 5B, FIG. 5C, FIG. 5D, FIG. 5E, FIG. 5F, FIG. 5G, and FIG. 5H illustrate intermediate operations of a method for manufacturing a semiconductor device package according to some embodiments of the present disclosure.

Referring to FIG. 5A, the method for manufacturing the semiconductor device package 1 includes providing a carrier 10'. The carrier 10' may be a preformed lead frame, for example, a quad flat no lead (QFN) structure. The carrier 10' includes a Cu alloy.

Figure 5B:
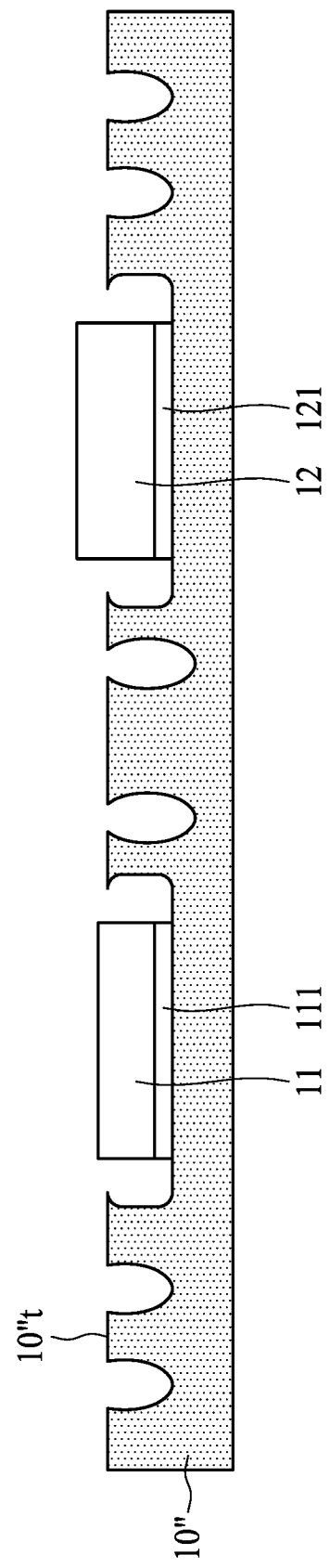

Referring to FIG. 5B, a half etching operation is performed on the carrier 10' to form a suitable number of recesses accommodating the semiconductor devices, for example, semiconductor devices 11 and 12. The semiconductor devices 11 and 12 may be disposed on a top surface 10"t of an etched carrier 10" through the adhesives 111 and 121, respectively. Through the half etching operation, the etched carrier 10" can include a patterned surface at the top surface 10"t, or hereinafter, a patterned layer or a patterned conductive layer.

Figure 5C:
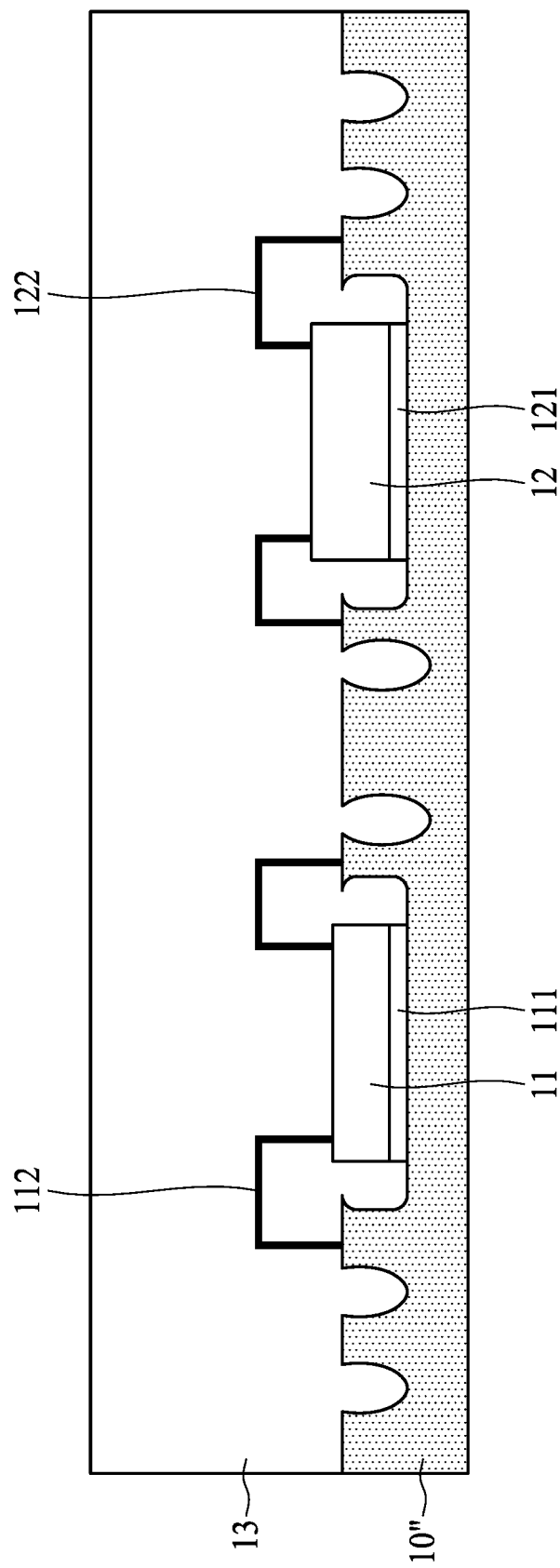

Referring to FIG. 5C, the semiconductor devices 11 and 12 are bonded to the etched carrier 10" through the conductive wires 112 and 122, respectively. The encapsulant 13 can be disposed on the top surface 10"t of the etched carrier 10". The encapsulant 13 encapsulates the semiconductor devices 11 and 12. In some other embodiments, the semiconductor devices 11 and 12 may be flip-chip bonded to the carrier 10".

Figure 5D:
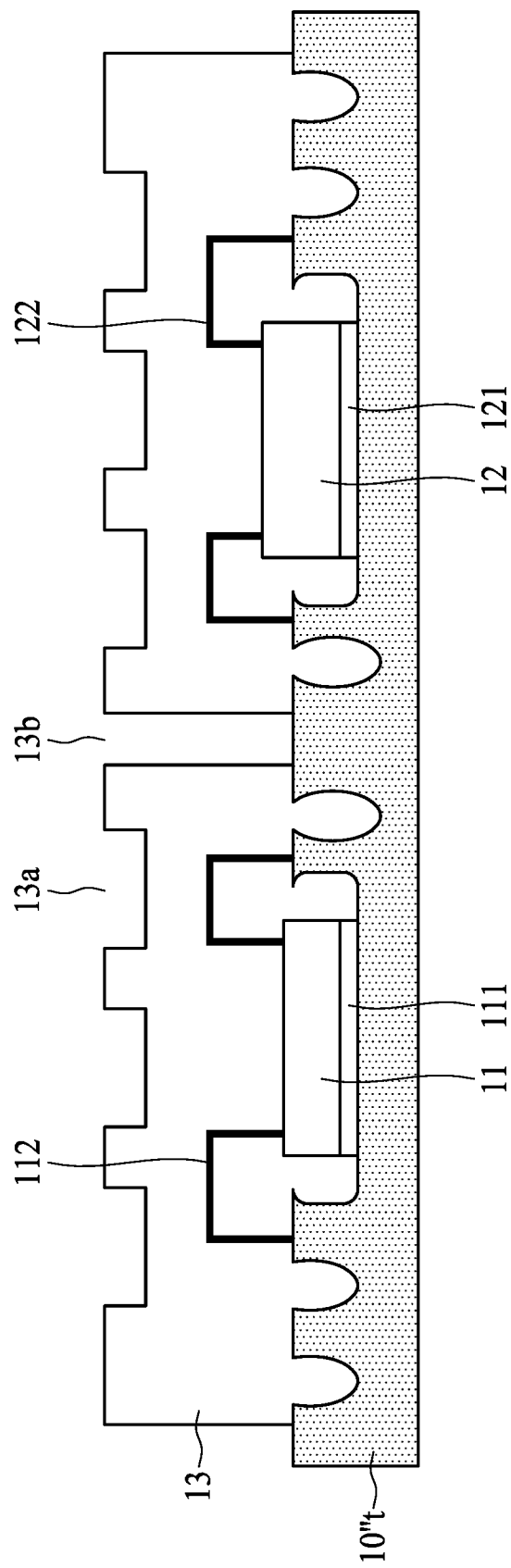

Referring to FIG. 5D, trenches 13a and 13b are formed in the encapsulant 13 by a laser removing operation (e.g., laser ablation) or any other suitable operations. As exemplified in FIG. 5D, trench 13b is formed between the compartment accommodating the semiconductor device 11 and the compartment accommodating the semiconductor device 12. A width of the trenches 13a and 13b may be controlled by the laser removing operation. As illustrated, a depth of the trench 13b may be different from a depth of the trench 13a. A width of the trench 13b may also be different from a width of the trench 13a. In some embodiments, the depth of the trench 13b allows the top surface 10"t of the etched carrier 10" to expose from the encapsulant 13 while the trench 13a is situated in proximity to the top surface 13t of the encapsulant. In some embodiments, the depth of the trench 13b is greater than the depth of the trench 13a. In some embodiments, the trench 13b can be subsequently formed with a shielding layer and the trench 13a can be subsequently formed with an antenna structure.

The trenches 13a and 13b are formed from a top surface of the encapsulant 13. The trenches 13a may project over the semiconductor devices 11 and 12. The trench 13b may be positioned between the semiconductor device 11 and semiconductor device 12.

Figure 5E:
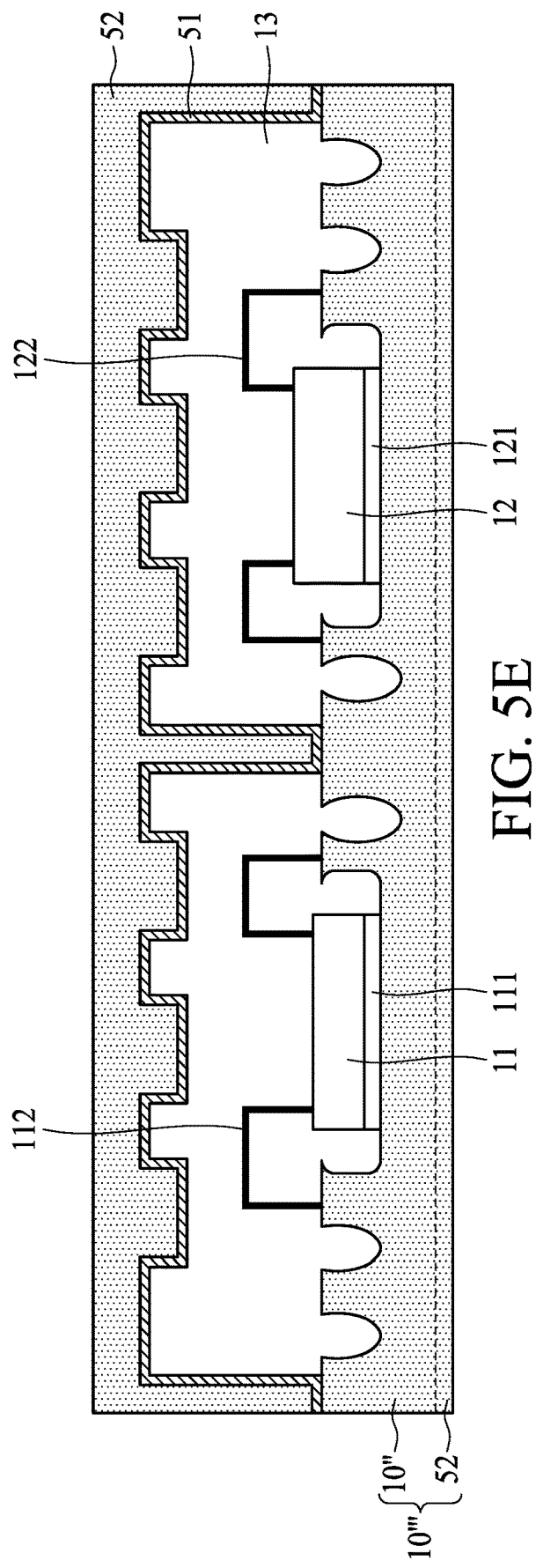

Referring to FIG. 5E, a seed layer 51 may be formed on an outer surface of the encapsulant 13. The seed layer 51 may be formed on a portion of the etched carrier 10" exposed from the encapsulant 13. The seed layer 51 may be formed in the trenches 13a and 13b of the encapsulant 13. The seed layer 51 may be formed by a sputtering operation. The seed layer 51 may include Ti, TiCu or other suitable materials. The seed layer 51 may include a magnetic material such as Ni, Fe, or stainless steel. The seed layer 51 may include materials with high magnetic conductivity. A conductive layer 52 is then formed on the seed layer 51 by a plating operation (e.g. electroplating or electroless plating operation) or other suitable operations. The conductive layer 52 is formed in the trenches 13a and 13b. Simultaneously, the conductive layer 52 may be formed on the backside of the etched carrier 10" so that the etched carrier 10" together with the newly deposited conductive layer 52 forming a composite carrier 10'''. The original carrier 10' may include conductive materials such as copper; therefore, formation of the conductive layer 52 on the original carrier 10' of current disclosure may be more advantageous than on the organic carrier counterpart, as far as the plating operation is concerned. For example, the conductive layer 52 formed on the etched carrier 10" may possess a better thickness uniformity than the same formed on the organic carrier counterpart. In addition, the production throughput of forming the conductive layer 52 on the etched carrier 10" can be greater than that on the organic carrier counterpart.

A boundary between the etched carrier 10" and the conductive layer 52 may be observed. The conductive layer 52 includes Cu or other suitable materials. In some embodiments, the seed layer 51 can be formed by a sputter operation. The sputtered seed layer may be selectively formed on the front side of the etched carrier 10" and the encapsulant 13. As exemplified in FIG. 5E, the carrier 10''' can possess a bi-layer structure.

In some other embodiments, the seed layer 51 may be formed by an electroplating operation, an electroless plating operation, or other suitable operations. Under such situations, the seed layer 51 would be formed both on the frontside (e.g., the side with semiconductor devices 11, 12 and encapsulant 13) and the backside of the etched carrier 10". Accordingly, after the formation of the seed layer and the conductive layer 52, the carrier 10''' can possess a tri-layer structure (not shown in FIG. 5E), as exemplified in FIG. 4.

Figure 5F:
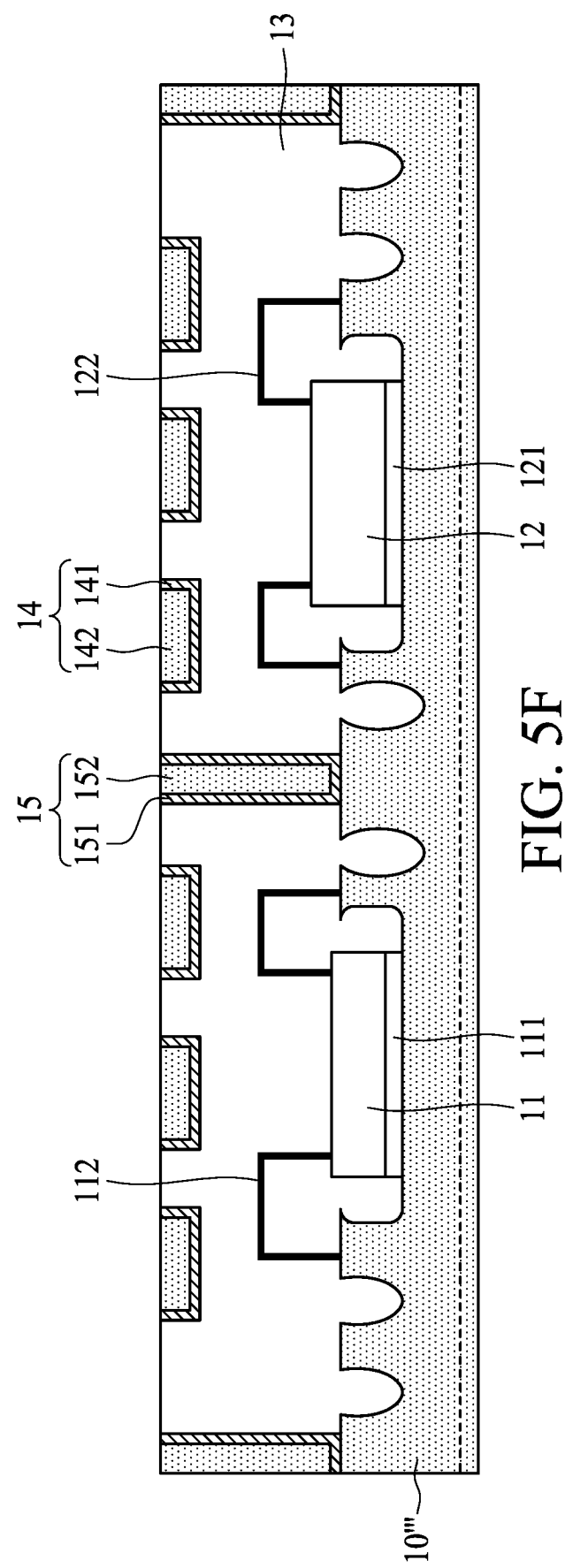

Referring to FIG. 5F, a portion of the seed layer 51 and the conductive layer 52 are removed by a grinding operation to form the antenna 14 and the shielding layer 15. The antenna 14 includes the seed layer 141 and the conductive layer 142. The shielding layer 15 includes the seed layer 151 and the conductive layer 152. After the grinding operation, the top surfaces of the antenna 14, the shielding layer 15, and the encapsulant 13 may be substantially coplanar, as exemplified in FIG. 5F. The antenna 14 and the shielding layer 15 are formed simultaneously.

In some embodiments, top surfaces of the antenna 14 and the shielding layer 15 after grinding may be recessed from the top surface of the encapsulant 13 as a result of a flash etching operation following the grinding operation. The recess of the antenna 14 and the shielding layer 15 due to the flash etching operation may appear as a dishing structure. Under this situation, a top surface of the etched antenna or etched shielding layer may be lower than the top surface of the encapsulant 13. Such configuration of the antenna and shielding layer may be advantageous for scratch avoidance during subsequent manufacturing or handling processes.

In some embodiments, a protection layer (not shown in FIG. 5F) with a conductive material or insulated material may be formed on the top surface of the antenna 14 and the top surface of the shielding layer 15 by an electroplating operation, a spraying operation, or other suitable operations. The protection layer may include Ni, Au, Pd, alloy of the same, or other suitable materials. The protection layer with a dielectric or insulated material may be formed on the antenna 14 and the shielding layer 15 by a spraying operation. The protection layer may include a solder mask layer or other suitable materials.

Figure 5G:
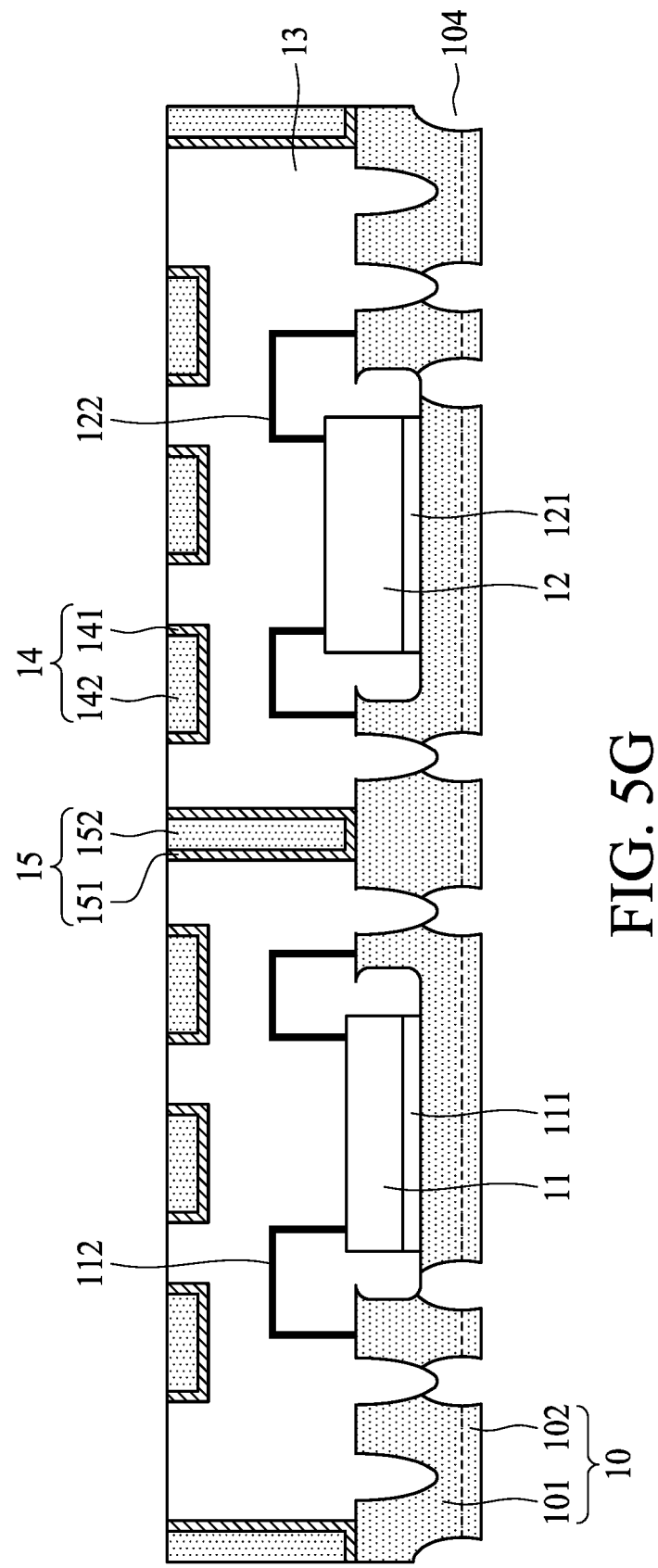
Figure 5H:
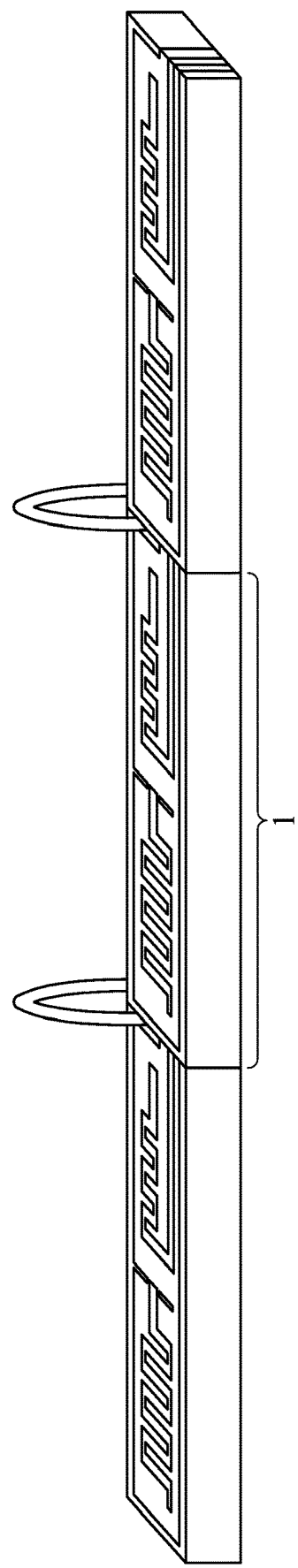

Referring to FIG. 5G, a half etching operation is performed on the carrier 10''', for example, on a backside of the carrier 10''', so that the backside of the carrier 10''' is patterned. After the backside half etching operation, the carrier 10 associated with two conductive layers 101 and 102 is obtained. The backside half etching operation of the carrier 10''' may be performed after the formation of the antenna 14 and the shielding layer 15. The backside surface morphology or pattern of the carrier 10 may be controlled during the backside half etching operation. The carrier 10 includes a conductive layer 101 in proximity to the semiconductor devices 11, 12, and the encapsulant 13, and a conductive layer 102 opposite to the conductive layer 101. The recess 104 can be formed during the backside etching operation. In some embodiments, the recesses 104 are designed to avoid positions under the projection of the semiconductor devices 11, 12. After the singulation operation of the semiconductor device package 1, as shown in FIG. 5H, the position of the recess 104 can be adjacent to a backside periphery of the singulated semiconductor device package. In some embodiments, a formation of a protection layer on the top surface of the antenna 14 and on the top surface of the shielding layer 15 may be formed during, before, or after the half etching operation of FIG. 5G.

In some embodiments, after the half etching operation, a surface finish material (e.g. Sn or NiPdAg) may be plated on the back surface of the carrier 10 to protect the bottom side of the carrier 10. In other embodiments the surface finish material may be formed by ink jet printing a solder mask over the back surface of the carrier 10. In some embodiments, the surface finish material may possess low absorption rate to electromagnetic wave.

Referring to FIG. 5H, a singulation operation is performed to form the semiconductor device package 1. During the singulation operation, a suitable number of compartments can be separated or sawed by a laser-sawing operation. The laser can be focused on the shielding layer 15 when performing the laser-sawing operation, and after the operation, the shielding layer 25 of individual separated package can be laterally exposed from the encapsulant 13. In some other embodiments, a roller blade can be implemented to individually, or combine with the laser blade, perform the aforesaid separation or sawing operation.

FIG. 6A through FIG. 6H illustrate some embodiments of a method of manufacturing the semiconductor device package 2 according to some embodiments of the present disclosure. Various figures have been simplified to more clearly present aspects of the present disclosure. The operations of the method of manufacturing the semiconductor device package 2 may be similarly applied to the semiconductor device packages of FIGS. 2A, 3, and 4.

Figure 6A:
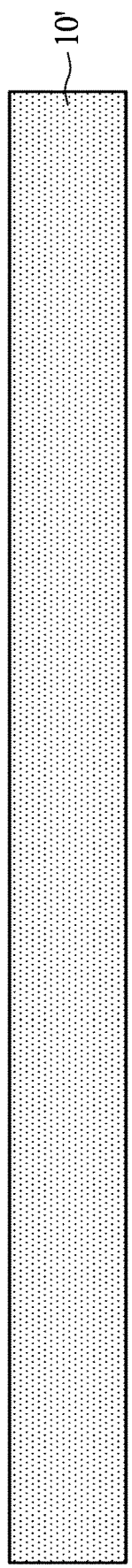
FIG. 6A, FIG. 6B, FIG. 6C, FIG. 6D, FIG. 6E, FIG. 6F, FIG. 6G, and FIG. 6H illustrate intermediate operations of a method for manufacturing a semiconductor device package according to some embodiments of the present disclosure.

Referring to FIG. 6A, the method for manufacturing the semiconductor device package 2 includes providing a carrier 10'. The carrier 10' may be a preformed lead frame, for example, a quad flat no lead (QFN) structure. The carrier 10' includes a Cu alloy.

Figure 6B:
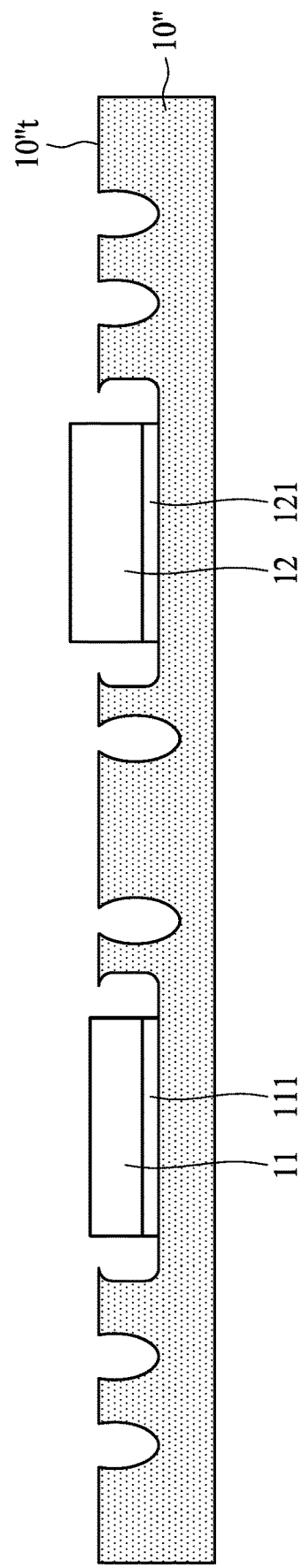

Referring to FIG. 6B, a half etching operation is performed on the carrier 10' to form a suitable number of recesses accommodating the semiconductor devices, for example, semiconductor devices 11 and 12. The semiconductor devices 11 and 12 may be disposed on a top surface 10"t of an etched carrier 10" through the adhesives 111 and 121, respectively. Through the half etching operation, the etched carrier 10" can includes a patterned surface at the top surface 10"t, or hereinafter, a patterned layer or a patterned conductive layer.

Figure 6C:
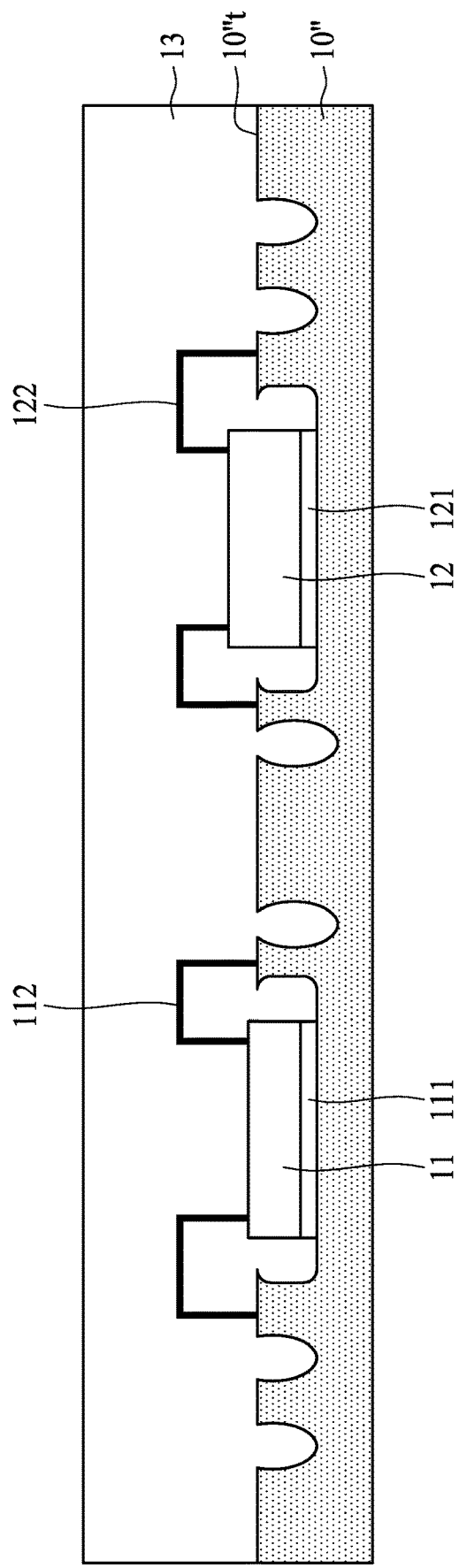

Referring to FIG. 6C, the semiconductor devices 11 and 12 are bonded to the etched carrier 10" through the conductive wires 112 and 122, respectively. The encapsulant 13 can be disposed on the top surface 10"t of the etched carrier 10". The encapsulant 13 encapsulates the semiconductor devices 11 and 12. In some other embodiments, the semiconductor devices 11 and 12 may be flip-chip bonded to the carrier 10".

Figure 6D:
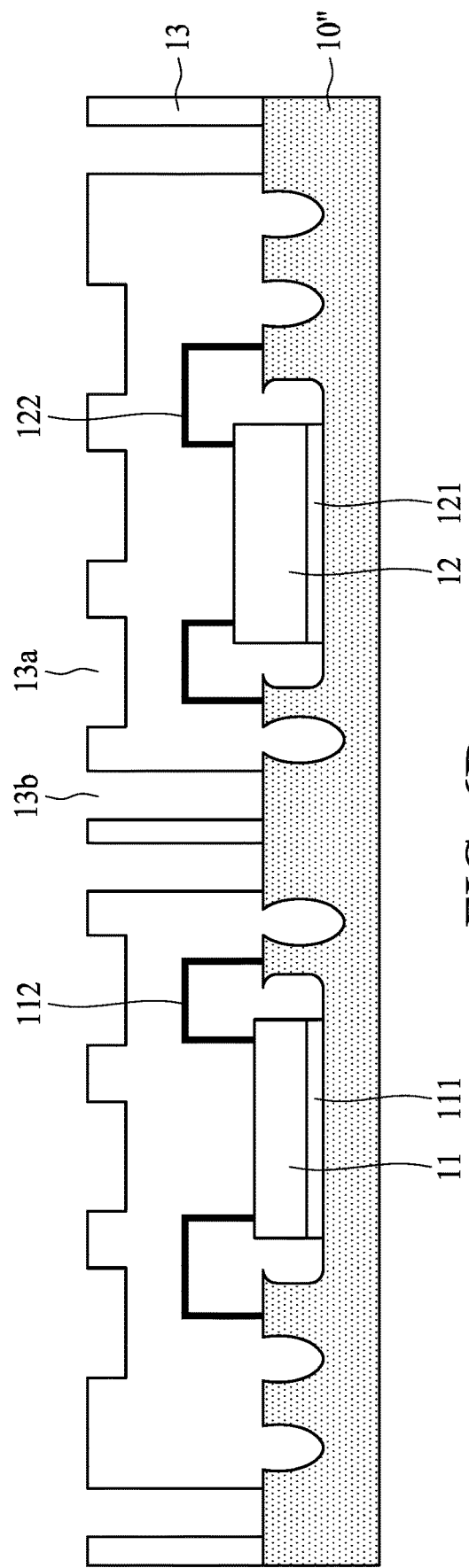

Referring to FIG. 6D, trenches 13a and 13b are formed in the encapsulant 13 by a laser removing operation (e.g., laser ablation) or any other suitable operations. As exemplified in FIG. 6D, several trenches 13b may be formed between the compartment accommodating the semiconductor device 11 and the compartment accommodating the semiconductor device 12. A width of the trenches 13a and 13b may be controlled by the laser removing operation. As illustrated, a depth of the trench 13b may be different from a depth of the trench 13a. A width of the trench 13b may also be different from a width of the trench 13a. In some embodiments, the depth of the trench 13b allows the top surface 10"t of the etched carrier 10" to expose from the encapsulant 13 while the trench 13a is situated in proximity to the top surface 13t of the encapsulant. In some embodiments, the depth of the trench 13b is greater than the depth of the trench 13a. In some embodiments, the trench 13b can be subsequently formed with a shielding layer and the trench 13a can be subsequently formed with an antenna structure.

The trenches 13a and 13b are formed from a top surface of the encapsulant 13. The trenches 13a may project over the semiconductor devices 11 and 12. The trench 13*b* may be positioned between the semiconductor device 11 and semiconductor device 12.

Figure 6E:
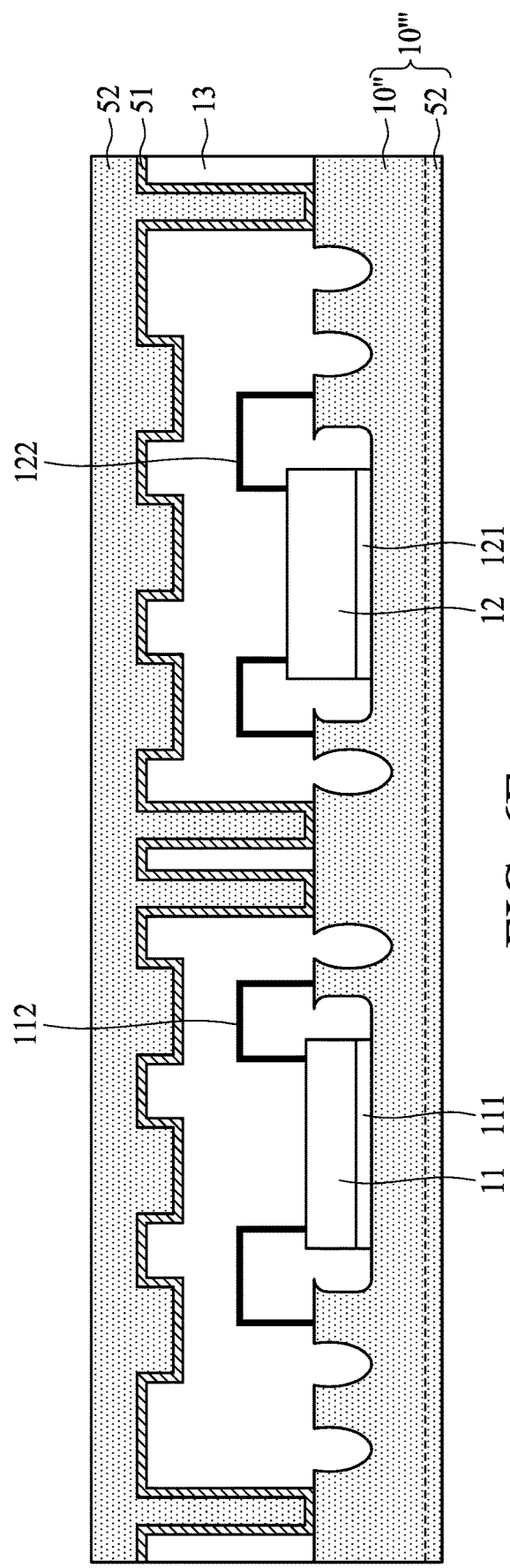

Referring to FIG. 6E, a seed layer 51 may be formed on the encapsulant 13 following the contour of the trenches 13*a* and 13*b*. The seed layer 51 may be formed on a portion of the etched carrier 10" exposed from the encapsulant 13. The seed layer 51 can be formed in the trenches 13*a* and 13*b* of the encapsulant 13. The seed layer 51 may be formed by a sputtering operation. The seed layer 51 may include Ti, TiCu or other suitable materials. The seed layer 51 may include a magnetic material such as Ni, Fe, or stainless steel. The seed layer 51 may include materials with high magnetic conductivity. A conductive layer 52 is then formed on the seed layer 51 by a plating operation or other suitable operations. The conductive layer 52 may be formed in the trenches 13*a* and 13*b*. Simultaneously, the conductive layer 52 may be formed on the backside of the etched carrier 10" to form a carrier 10''' so that the etched carrier 10" together with the newly deposited conductive layer 52 forming a composite carrier 10'''. The original carrier 10' may include conductive materials such as copper, therefore, formation of the conductive layer 52 on the original carrier 10' of current disclosure may be more advantageous than on the organic carrier counterpart, as far as the plating operation is concerned. For example, the conductive layer 52 formed on the etched carrier 10" may possess a better thickness uniformity than the same formed on the organic carrier counterpart. In addition, the production throughput of forming the conductive layer 52 on the etched carrier 10" can be greater than that on the organic carrier counterpart.

A boundary between the etched carrier 10" and the conductive layer 52 may be observed. The conductive layer 52 includes Cu or other suitable materials. In some embodiments, the seed layer 51 can be formed by a sputter operation, the sputtered seed layer may be selectively formed on the frontside of the etched carrier 10" and the encapsulant 13. As exemplified in FIG. 6E, the carrier 10''' can possess a bi-layer structure.

In some other embodiments, the seed layer 51 may be formed by an electroplating operation, an electroless plating operation, or other suitable operations. Under such situations, the seed layer 51 would be formed both on the frontside (e.g., the side with semiconductor devices 11. 12 and encapsulant 13) and the backside of the etched carrier 10". Accordingly, after the formation of the seed layer and the conductive layer 52, the carrier 10''' can possess a tri-layer structure (not shown in FIG. 5E), as exemplified in FIG. 4.

Figure 6F:
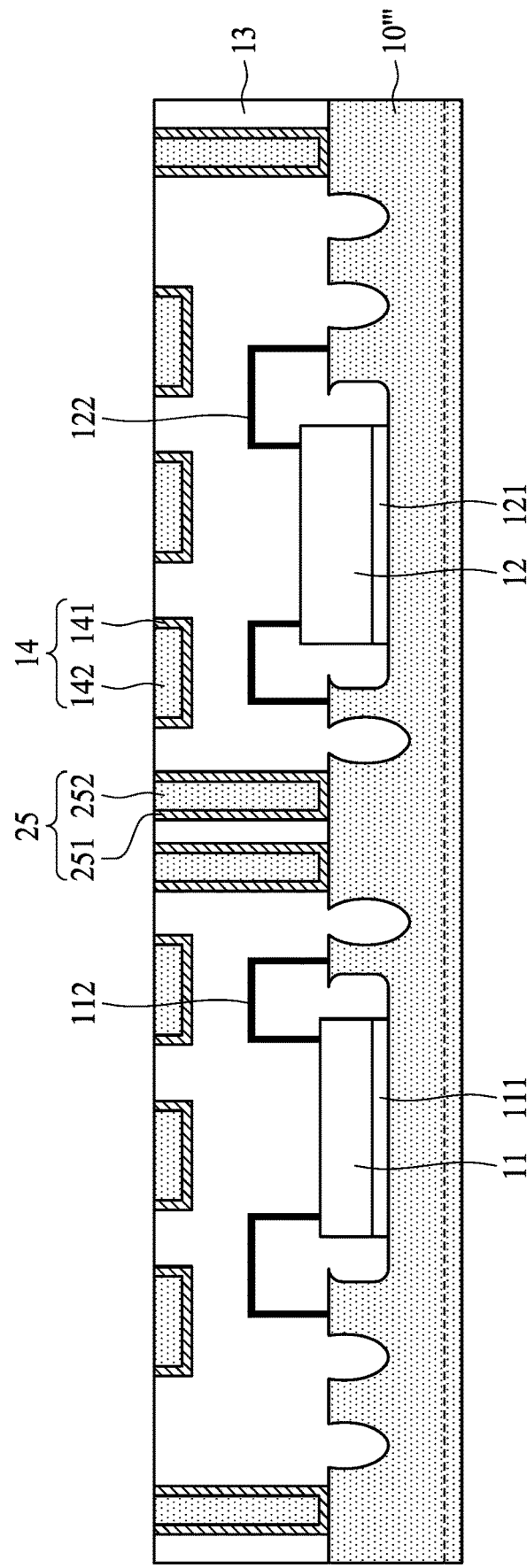

Referring to FIG. 6F, a portion of the seed layer 51 and the conductive layer 52 are removed by a grinding operation to form the antenna 14 and the shielding layer 25. The antenna 14 includes the seed layer 141 and the conductive layer 142. The shielding layer 25 includes the seed layer 251 and the conductive layer 252. After the grinding operation, the top surfaces of the antenna 14, the shielding layer 25, and the encapsulant 13 may be substantially are coplanar, as exemplified in FIG. 6F.

In some embodiments, top surfaces of the antenna 14 and the shielding layer 25 after grinding may be recessed from the top surface of the encapsulant 13 as a result of a flash etching operation following the grinding operation. The recess of the antenna 14 and the shielding layer 15 due to the flash etching operation may appear as a dishing structure. Under this situation, a top surface of the etched antenna or etched shielding layer would be lower than the top surface of the encapsulant 13. Such configuration of the antenna and shielding layer may be advantageous for scratch avoidance during subsequent manufacturing or handling processes.

In some embodiments, a protection layer (not shown in FIG. 6F) with a conductive material or insulated material may be formed on the top surface of the antenna 14 and the top surface of the shielding layer 25 by an electroplating operation, a spraying operation, or other suitable operations. The protection layer may include Ni, Au, Pd, alloy of the same, or other suitable materials. The protection layer with a dielectric or insulated material may be formed on the antenna 14 and the shielding layer 25 by a spraying operation. The protection layer may include a solder mask layer or other suitable materials.

Figure 6G:
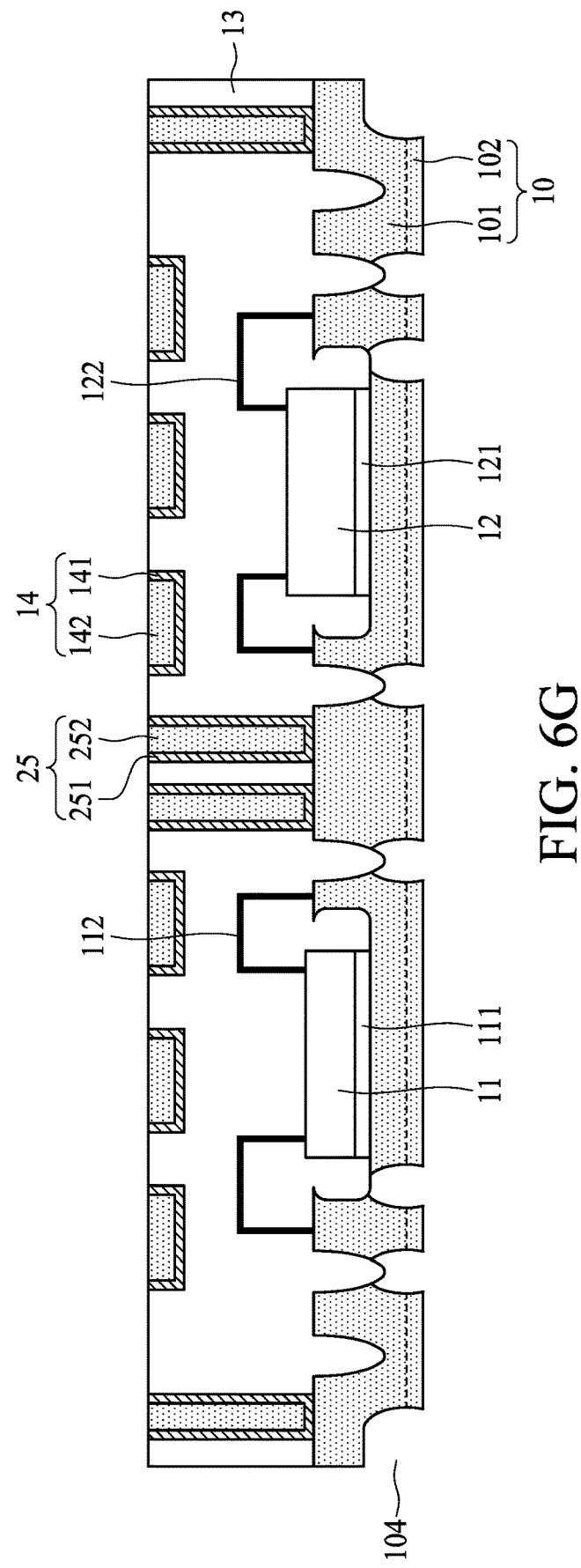
Figure 6H:
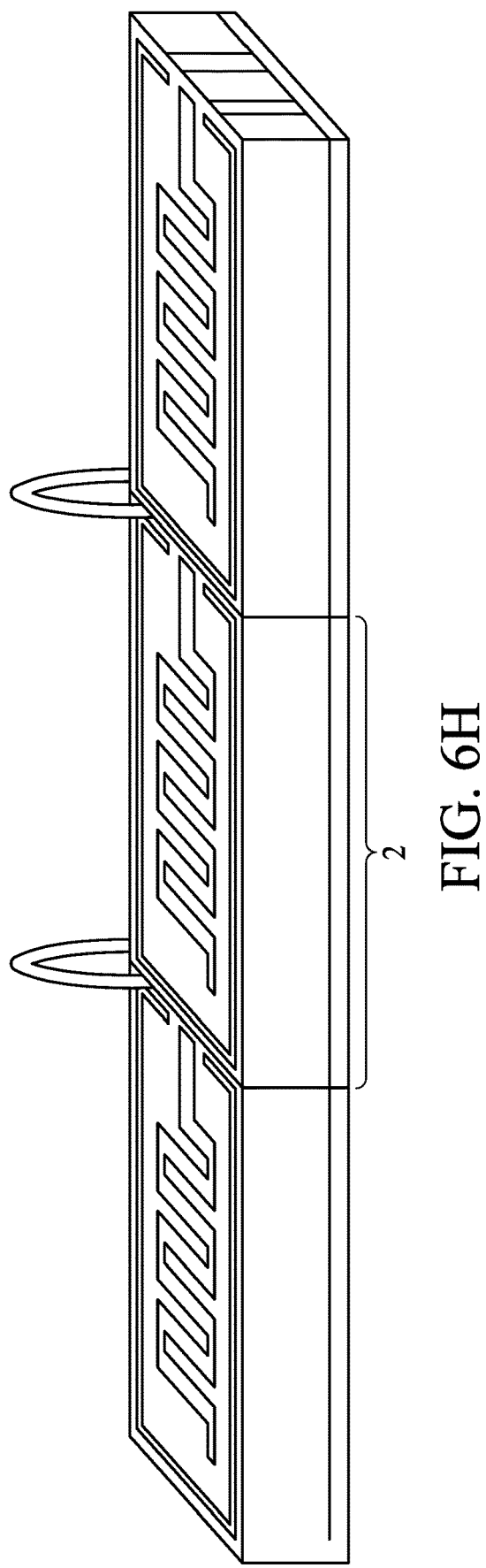

Referring to FIG. 6G, a half etching operation is performed on the carrier 10''', for example, on a backside of the carrier 10''', so that the backside of the carrier 10''' is patterned. After the backside half etching operation, the carrier 10 associated with two conductive layers 101 and 102 is obtained. The backside half etching operation of the carrier 10''' may be performed after the formation of the antenna 14 and the shielding layer 15. The backside surface morphology or pattern of the carrier 10 may be controlled during the backside half etching operation. The carrier 10 includes a conductive layer 101 in proximity to the semiconductor devices 11, 12, and the encapsulant 13, and a conductive layer 102 opposite to the conductive layer 101. The recess 104 can be formed during the backside etching operation. In some embodiments, the recesses 104 may be designed to avoid positions under the projection of the semiconductor devices 11, 12. After the singulation operation of the semiconductor device package 1, as shown in FIG. 6H, the position of the recess 104 can be adjacent to a backside periphery of the singulated semiconductor device package. In some embodiments, a formation of a protection layer on the top surface of the antenna 14 and on the top surface of the shielding layer 15 may be formed during, before, or after the half etching operation of FIG. 6G.

Referring to FIG. 6H, a singulation operation is performed to form the semiconductor device package 2. During the singulation operation, a suitable number of compartments can be separated or sawed by a laser-sawing operation. The laser can be focused on the encapsulant 13 between adjacent shielding layers 25 when performing the laser-sawing operation, and after the operation, the shielding layer 25 of individual separated package can be laterally encapsulated by the encapsulant 13. In some other embodiments, a roller blade can be implemented to individually, or combine with the laser blade, perform the aforesaid separation or sawing operation.

Figure 7:
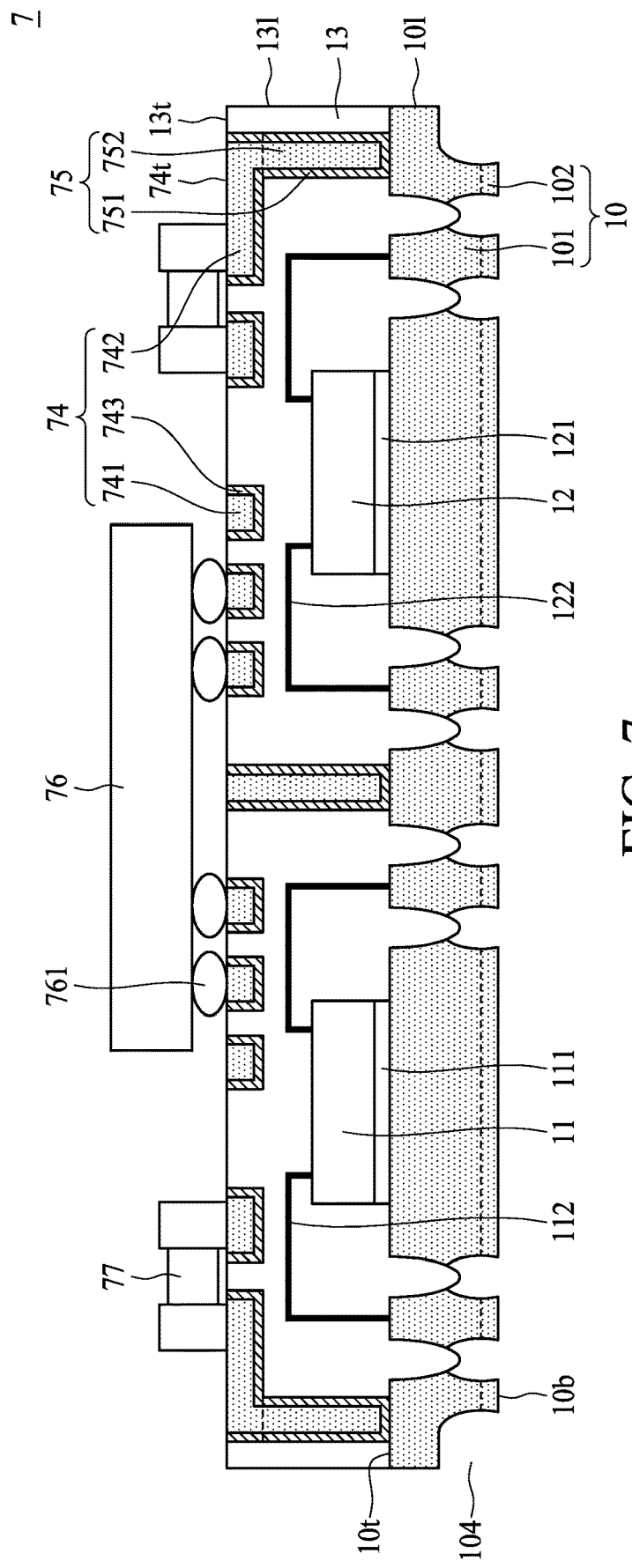
FIG. 7 illustrates a cross-sectional view of a semiconductor device package according to some embodiments of the present disclosure.

FIG. 7 is a cross-sectional view of a semiconductor device package 7 in accordance with some embodiments of the present disclosure. The semiconductor device package 7 includes a carrier 10, semiconductor devices 11, 12, and 76, an encapsulant 13, a patterned conductive layer 74, an interconnection element 75, and an electronic component 77.

The configuration and materials of the carrier 10, the semiconductor devices 11 and 12, and the encapsulant 13 are similar to those of FIG. 1A. The encapsulant 13 has a plurality of trenches to accommodate the patterned conductive layer 74 and the interconnection element 75. The trench accommodating the patterned conductive layer 74 may be shallower than the trench accommodating the interconnection element 75.

The patterned conductive layer 74 includes a conductive layer 741, a conductive layer 742, and a seed layer 743. The conductive layer 741 and the conductive layer 742 may be traces. In some embodiments, the conductive layer 741 may be a conductive pad. The seed layer 743 may include Ti, TiCu or other suitable materials. The conductive layers 741 and 742 may include Cu or other suitable materials. The conductive layer 741 is separated from the encapsulant 13 by the seed layer 743. The conductive layer 742 is separated from the encapsulant 13 by the seed layer 743. The conductive layers 741 and 742 are surrounded by the seed layer 743.

The patterned conductive layer 74 is embedded in the tranches of the encapsulant 13. A thickness of the patterned conductive layer 74 may be adjusted. In some embodiments, a top surface of the patterned conductive layer 74 may be coplanar with the top surface of the encapsulant 13. The top surface of the patterned conductive layer 74 may be higher than or lower than the top surface of the encapsulant 13. In some comparative embodiments where solely a bottom side of a patterned conductive layer is in contact with the encapsulant 13 (e.g., the patterned conductive layer is patterned on a top surface of the encapsulant), the embedded patterned conductive layer 74 of present embodiment possesses a better adhesion by forming contacts at the bottom side and lateral sides to the encapsulant 13. Additionally, a pitch of the patterned conductive layer 74 (e.g. a distance between a center of one conductive layer 741 and a center of an adjacent conductive layer 741) may be easily controlled in order to match with the pitch of the conductive bump of the semiconductor device 76.

The interconnection element 75 includes a seed layer 751 and a conductive via 752. The seed layer 751 may include Ti, TiCu or other suitable materials. The conductive via 752 may include Cu or other suitable materials. The interconnection element 75 electrically connects the patterned conductive layer 74 to the carrier 101. The interconnection element 75 is in contact with the patterned conductive layer 74 and the carrier 101.

The semiconductor device 76 is disposed on the top surface 13*t* of the encapsulant 13. The semiconductor device 76 includes a conductive bump 761. The semiconductor device 76 is electrically connected to the patterned conductive layer 74 through the conductive bump 761. The conductive bump 761 is in contact with the conductive layer 741. The semiconductor device 76 may be a flip-chip bonded to the carrier 10. In some embodiments, the semiconductor device 76 may be wire-bonded to the carrier 10 through a conductive wire. The semiconductor device 76 may include a chip. The semiconductor device 76 may include a wafer level chip scale package. The semiconductor device 76 is different from the semiconductor device 11 or 12. In some embodiments, the semiconductor device 76 is free of any molding encapsulating thereover.

The electronic component 77 may be disposed on the top surface 13*t* of the encapsulant 13. The electronic component 77 is electrically connected to the patterned conductive layer 74. The electrical component 77 is in contact with the conductive layer 742. The electronic component 77 may be in contact with the conductive layers 741 and 742. In some embodiments, the electronic component 77 may be a passive component (including, for example, a capacitor, a resistor, or an inductor). The electronic component 77 may be electrically connected to the carrier 10. The electronic component 77 may be electrically connected to the semiconductor device 76. In some embodiments, the semiconductor device 76 may receive a signal through the electronic component 77 such that the signal would be stable.

Figure 8:
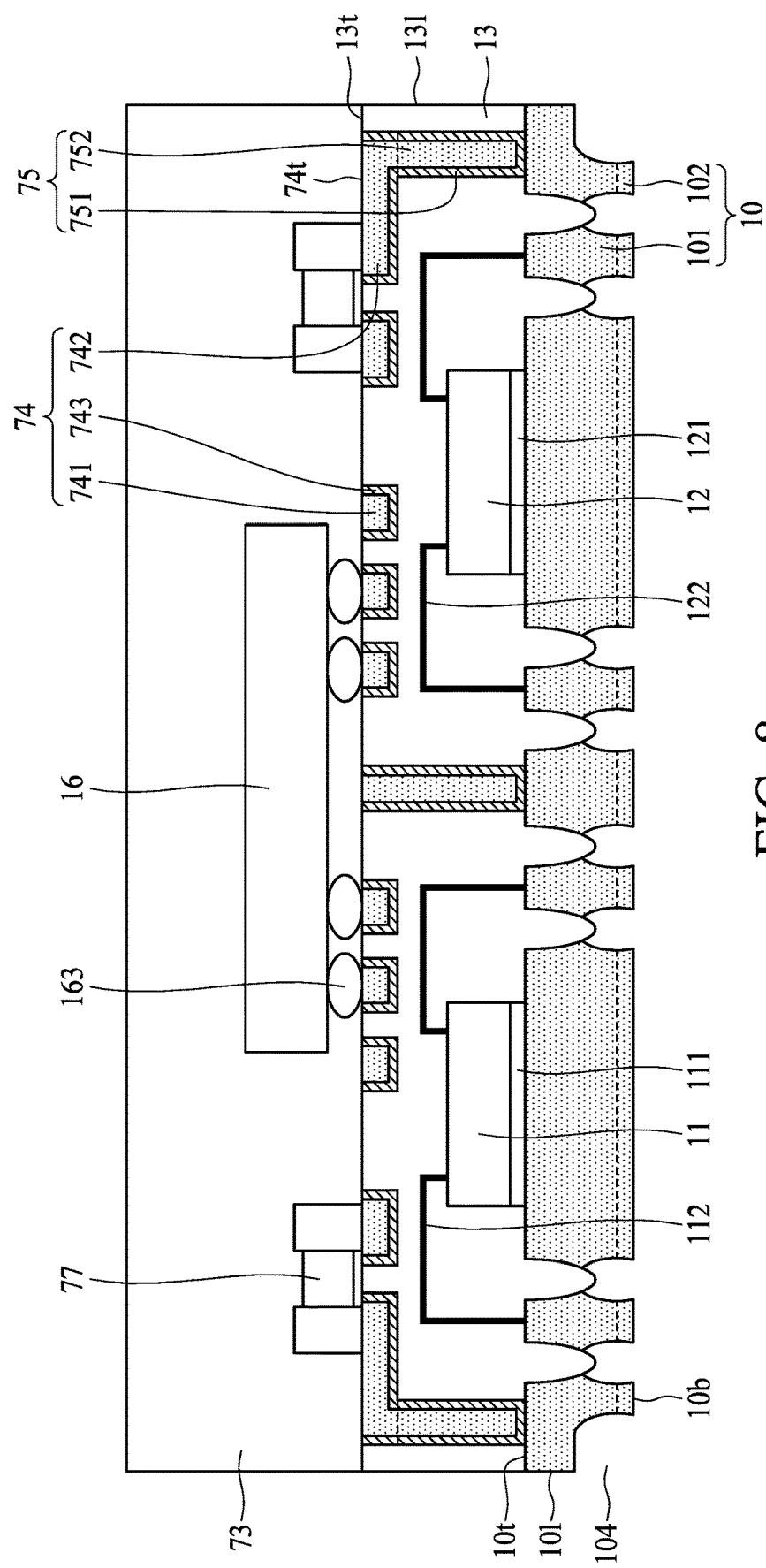
FIG. 8 illustrates a cross-sectional view of a semiconductor device package according to some embodiments of the present disclosure.

FIG. 8 is a cross-sectional view of a semiconductor device package 8 in accordance with some embodiments of the present disclosure. The semiconductor device package 8 is similar to the semiconductor device package 7 in FIG. 7 except that a semiconductor device 16 is disposed on the encapsulant 13 and molded by an encapsulant 73. The semiconductor device 16 and the electronic component 77 are protected by the encapsulant 73.

The semiconductor device 16 includes a conductive pad 163. The semiconductor device 16 has an active surface facing toward the encapsulant 13. The semiconductor device 16 is electrically connected to the patterned conductive layer 74. The conductive pad 163 is in contact with the conductive layer 741. In some embodiments, the semiconductor device 16 is electrically connected to the electronic component 77. The semiconductor device 16 is electrically connected to the carrier 10. The semiconductor device 16 is electrically connected to the semiconductor device 11 or 12.

In some embodiments, the semiconductor device 16 may be wire-bonded to the carrier 10. The semiconductor device 16 may be substantially the same as or different from the semiconductor device 11 or 12. The semiconductor device package 8 may function as a multi-chip module.

Figure 9A:
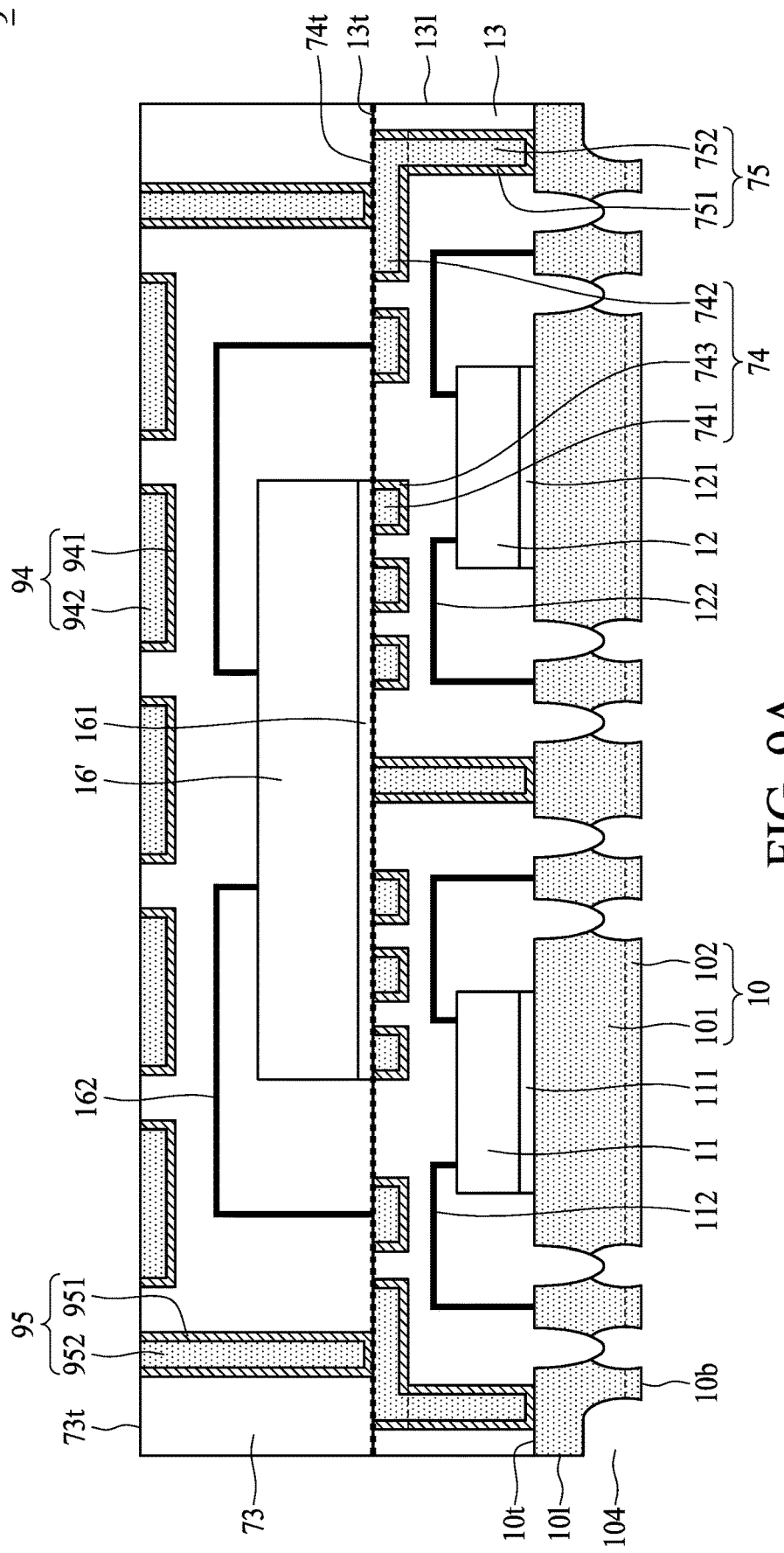
FIG. 9A illustrates a cross-sectional view of a semiconductor device package according to some embodiments of the present disclosure.

FIG. 9A is a cross-sectional view of a semiconductor device package 9 in accordance with some embodiments of the present disclosure. The semiconductor device package 9 is similar to the semiconductor device package 8 in FIG. 8 except that a semiconductor device 16' is wire-bonded to the carrier 10 and an antenna 94 and a shielding layer 95 are disposed in trenches of the encapsulant 73.

The encapsulant 73 has a top surface 73*t* opposite to the top surface 13*t* of the encapsulant 13. The encapsulant 73 has a trench to accommodate the antenna 94. The encapsulant 73 further has an additional trench to accommodate the shielding layer 95.

The configuration and functions of the antenna 94 are similar to those of the antenna 14 of FIG. 1A. The antenna 94 is disposed on the top surface 73*t* of the encapsulant 73. The antenna 94 is embedded in the encapsulant 73. The antenna 94 is encapsulated, at least laterally, by the encapsulant 73. The antenna 94 include a seed layer 941 and a conductive layer 942. The seed layer 941 may include Ti, TiCu or other suitable materials. The seed layer 941 may include a magnetic material such as Ni, Fe, or stainless steel. The seed layer 941 may include materials with high magnetic conductivity. The conductive layer 942 may include Cu or other suitable materials. The conductive layer 942 may be separated or spaced from the encapsulant 73 by the seed layer 941. The conductive layer 942 is surrounded by the seed layer 941 from sidewalls and bottom.

The configuration and functions of the shielding layer 95 are similar to those of the shielding layer 15 of FIG. 1A. The shielding layer 95 can be disposed on the patterned conductive layer 74. The shielding layer 95 may be disposed in the additional trench of the encapsulant 73. The shielding layer 95 is encapsulated by the encapsulant 73. The shielding layer 95 may surround the antenna 94 and the semiconductor device 16'. The shielding layer 95 is separated or spaced from the antenna 94 by the encapsulant 73.

The shielding layer 95 includes a seed layer 951 and a conductive layer 952. The seed layer 951 may include Ti, TiCu or other suitable materials. The seed layer 951 may include a magnetic material such as Ni, Fe, or stainless steel. The seed layer 951 may include materials with high magnetic conductivity. The conductive layer 952 may include Cu or other suitable materials. The conductive layer 952 is separated or spaced from the encapsulant 73 by the seed layer 951.

The semiconductor device package 9 may also include similar advantages of the semiconductor device packages 1, 2, 3, and 4 of FIGS. 1A, 2A, 3, and 4.

Figure 9B:
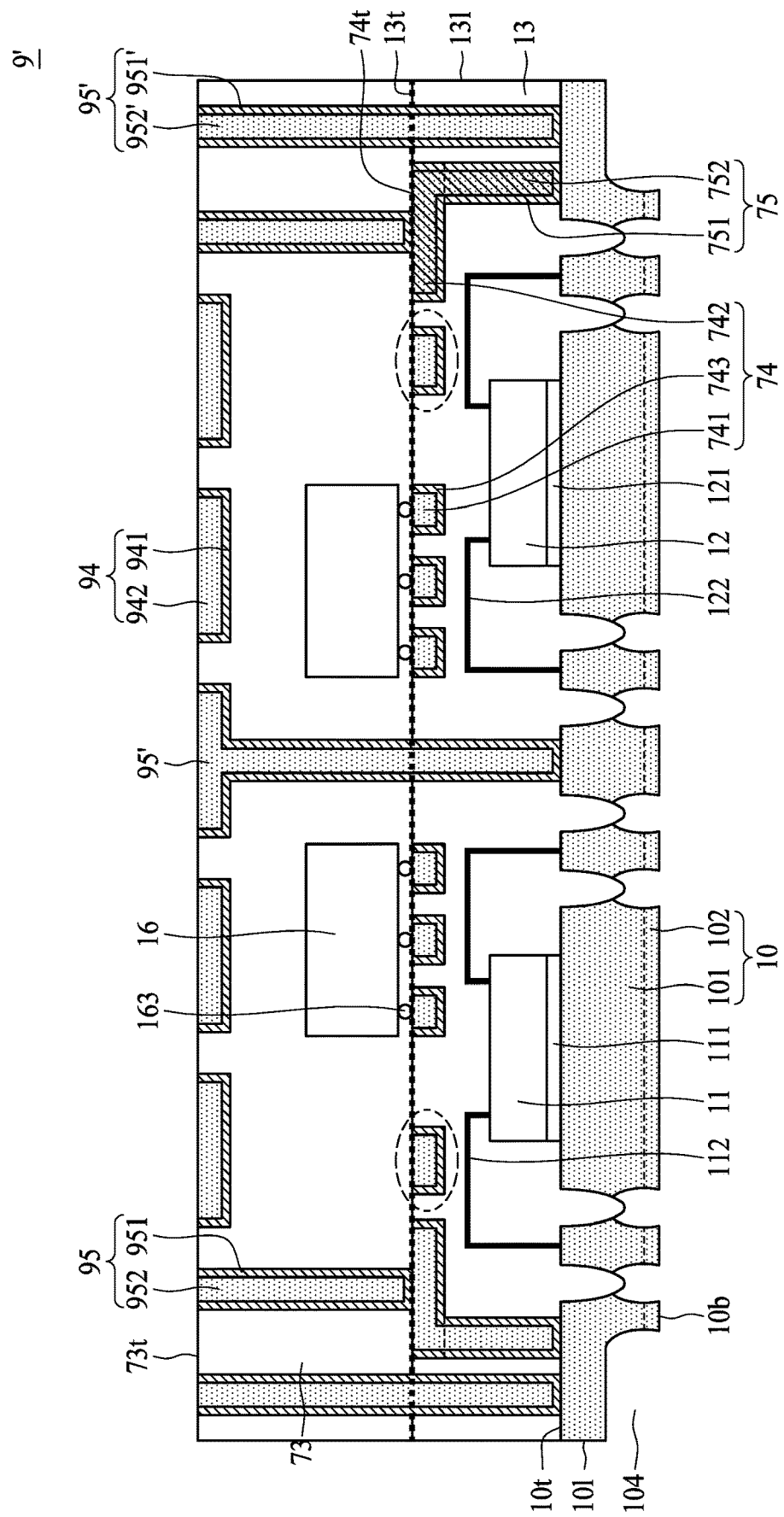
FIG. 9B illustrates a cross-sectional view of a semiconductor device package according to some embodiments of the present disclosure.

FIG. 9B is a cross-sectional view of a semiconductor device package 9' in accordance with some embodiments of the present disclosure. The semiconductor device package 9' is similar to the semiconductor device package 9 in FIG. 9A except that a portion of the patterned conductive layer 74 (e.g., the portion encircled by dotted lines) may function as an antenna, and an active surface of the semiconductor device 16 in the encapsulant 73 facing or in contact with the patterned conductive layer 74, and a shielding layer 95' may penetrate through the encapsulant 73 and encapsulant 13.

The configuration of the antenna, which may be a portion of the patterned conductive layer 74, may be substantially identical to the antenna 14 or 94 as previously described. The antenna is disposed on the encapsulant 13 and configured to interact with any one of the semiconductor devices 11 and 12. In some embodiments, the antenna may be disposed between the conductive layers 741 and 742 of the patterned conductive layer 74. In some embodiments, the antenna may be adjacent to the conductive layer 742. The antenna may be adjacent to the conductive layer 741.

The shielding layer 95' includes a seed layer 951' and a conductive layer 952'. The shielding layer 95' extends from the top surface 10t of the carrier 10 to the top surface 73t of the encapsulant 73. In some embodiments, the shielding layer 95 and the interconnection element 75 together function as a shielding layer. The shielding layer 95' may be disposed on the periphery of the carrier 10. The shielding layer 95' may be disposed on the center of the carrier 10. The shielding layer 95' may be disposed to surround any of the semiconductor devices 11, 12, 16.

FIG. 10A through FIG. 10H illustrate some embodiments of a method of manufacturing the semiconductor device package 7 according to some embodiments of the present disclosure. Various figures have been simplified to more clearly present aspects of the present disclosure. The operations of the method of manufacturing the semiconductor device package 7 may be similarly to those of manufacturing the semiconductor device package 1 of FIG. 5A through FIG. 5H.

Figure 10A:
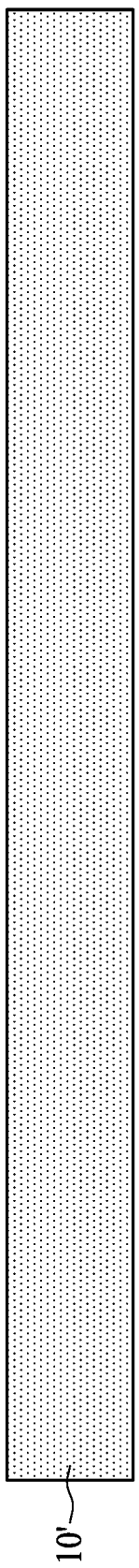
FIG. 10A, FIG. 10B, FIG. 10C, FIG. 10D, FIG. 10E, FIG. 10F, FIG. 10G, and FIG. 10H illustrate intermediate operations of a method for manufacturing a semiconductor device package according to some embodiments of the present disclosure.

Referring to FIG. 10A, the method for manufacturing the semiconductor device package 7 includes providing a carrier 10'. The carrier 10' may be a preformed lead frame, for example, a quad flat no lead (QFN) structure. The carrier 10' includes a Cu alloy.

Figure 10B:
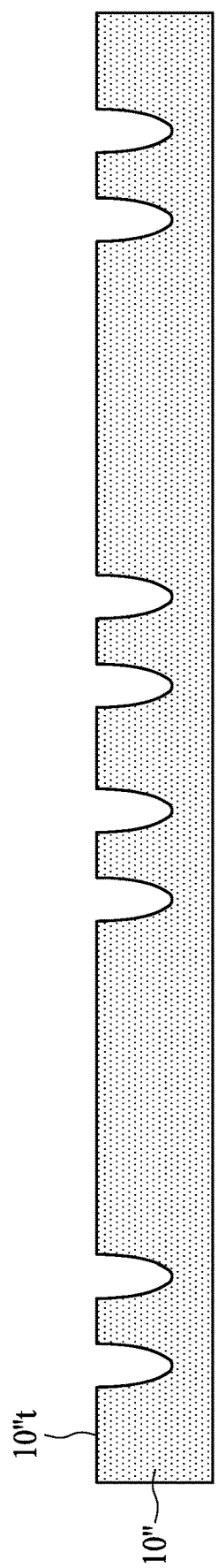

Referring to FIG. 10B, a half etching operation is performed on the carrier 10' to form a suitable number of recesses accommodating the semiconductor devices, for example, semiconductor devices 11 and 12. Through the half etching operation, the etched carrier 10" can include a patterned surface at a top surface 10"t, or hereinafter, a patterned layer or a patterned conductive layer.

Figure 10C:
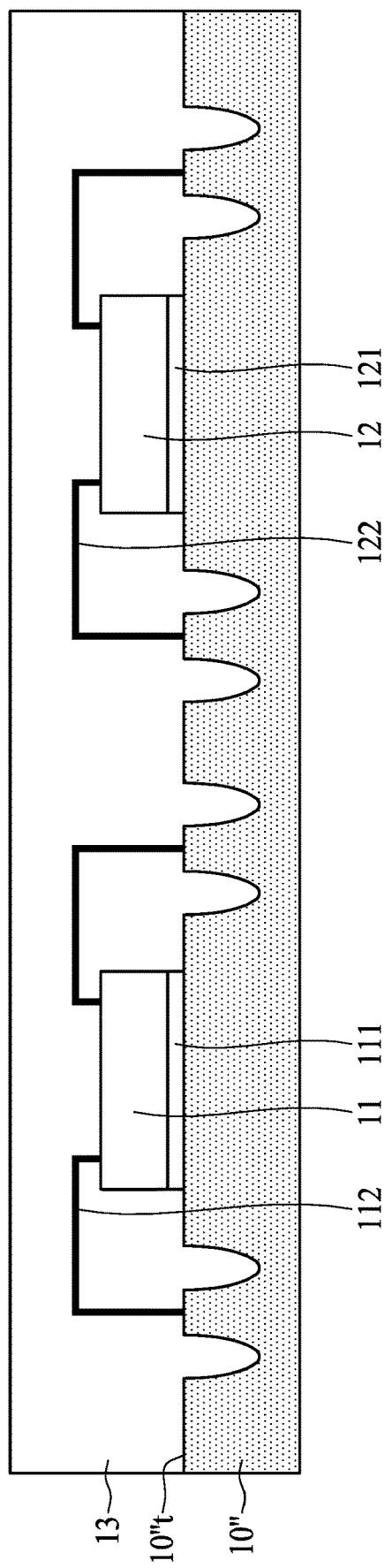

Referring to FIG. 10C, the semiconductor devices 11 and 12 are disposed on the top surface 10"t of an etched carrier 10" through the adhesives 111 and 121, respectively. The semiconductor devices 11 and 12 are bonded to the etched carrier 10" through the conductive wires 112 and 122, respectively. The encapsulant 13 is disposed on the top surface 10"t of the etched carrier 10". The encapsulant 13 encapsulates the semiconductor devices 11 and 12.

Figure 10D:
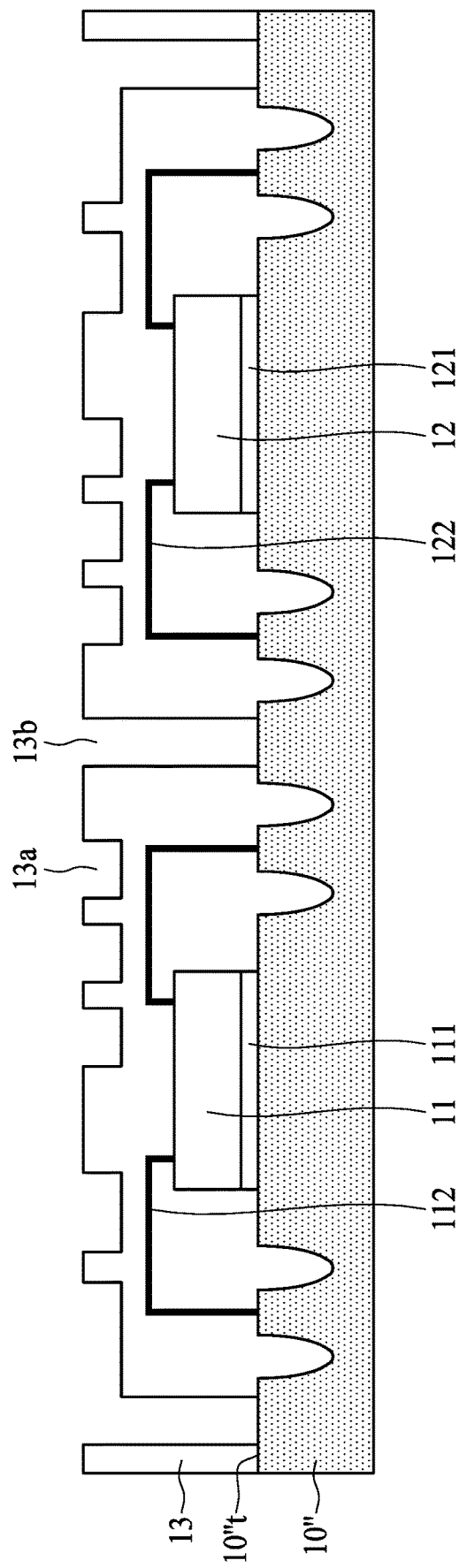

Referring to FIG. 10D, trenches 13a and 13b are formed in the encapsulant 13 by a laser removing operation (e.g., laser ablation) or any other suitable operations. As exemplified in FIG. 10D, the trench 13b is formed between the compartment accommodating the semiconductor device 11 and the compartment accommodating the semiconductor device 12. A width of the trenches 13a and 13b may be controlled by the laser removing operation. The pitch between the trenches 13a and 13b may be precisely controlled. As illustrated, a depth of the trench 13b may be different from a depth of the trench 13a. A width of the trench 13b may also be different from a width of the trench 13a. In some embodiments, the depth of the trench 13b allows the top surface 10"t of the etched carrier 10" to expose from the encapsulant 13 while the trench 13a is situated in proximity to the top surface 13t of the encapsulant. In some embodiments, the depth of the trench 13b is greater than the depth of the trench 13a. In some embodiments, the trench 13b can be subsequently formed with a shielding layer and the trench 13a can be subsequently formed with an antenna structure.

The trenches 13a and 13b are formed from a top surface of the encapsulant 13. The trenches 13a may project over the semiconductor devices 11 and 12. The trench 13b may be positioned between the semiconductor device 11 and semiconductor device 12.

Figure 10E:
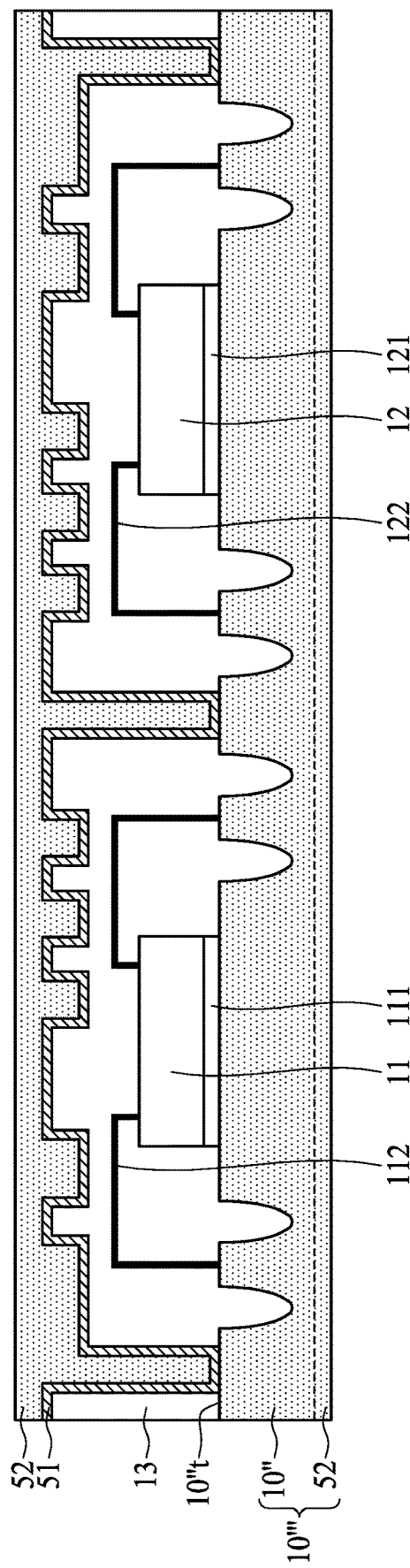

Referring to FIG. 10E, a seed layer 51 may be formed on an outer surface of the encapsulant 13. The seed layer 51 may be formed on a portion of the etched carrier 10" exposed from the encapsulant 13. The seed layer 51 may be formed in the trenches 13a and 13b of the encapsulant 13. The seed layer 51 may be formed by a sputtering operation. The seed layer 51 may include Ti, TiCu or other suitable materials. A conductive layer 52 is then formed on the seed layer 51 by a plating operation (e.g. electroplating or electroless plating operation) or other suitable operations. The conductive layer 52 is formed in the trenches 13a and 13b. Simultaneously, the conductive layer 52 may be formed on the backside of the etched carrier 10" so that the etched carrier 10" together with the newly deposited conductive layer 52 forming a composite carrier 10'". The original carrier 10' may include conductive materials such as copper; therefore, formation of the conductive layer 52 on the original carrier 10' of current disclosure may be more advantageous than on the organic carrier counterpart, as far as the plating operation is concerned. For example, the conductive layer 52 formed on the etched carrier 10" may possess a better thickness uniformity than the same formed on the organic carrier counterpart. In addition, the production throughput of forming the conductive layer 52 on the etched carrier 10" can be greater than that on the organic carrier counterpart.

A boundary between the etched carrier 10" and the conductive layer 52 may be observed. The conductive layer 52 includes Cu or other suitable materials. In some embodiments, the seed layer 51 can be formed by a sputter operation. The sputtered seed layer may be selectively formed on the front side of the etched carrier 10" and the encapsulant 13. As exemplified in FIG. 10E, the carrier 10'" can possess a bi-layer structure.

In some other embodiments, the seed layer 51 may be formed by an electroplating operation, an electroless plating operation, or other suitable operations. Under such situations, the seed layer 51 would be formed both on the frontside (e.g., the side with semiconductor devices 11. 12 and encapsulant 13) and the backside of the etched carrier 10". Accordingly, after the formation of the seed layer and the conductive layer 52, the carrier 10'" can possess a tri-layer structure (not shown in FIG. 10E), as exemplified in FIG. 4.

Figure 10F:
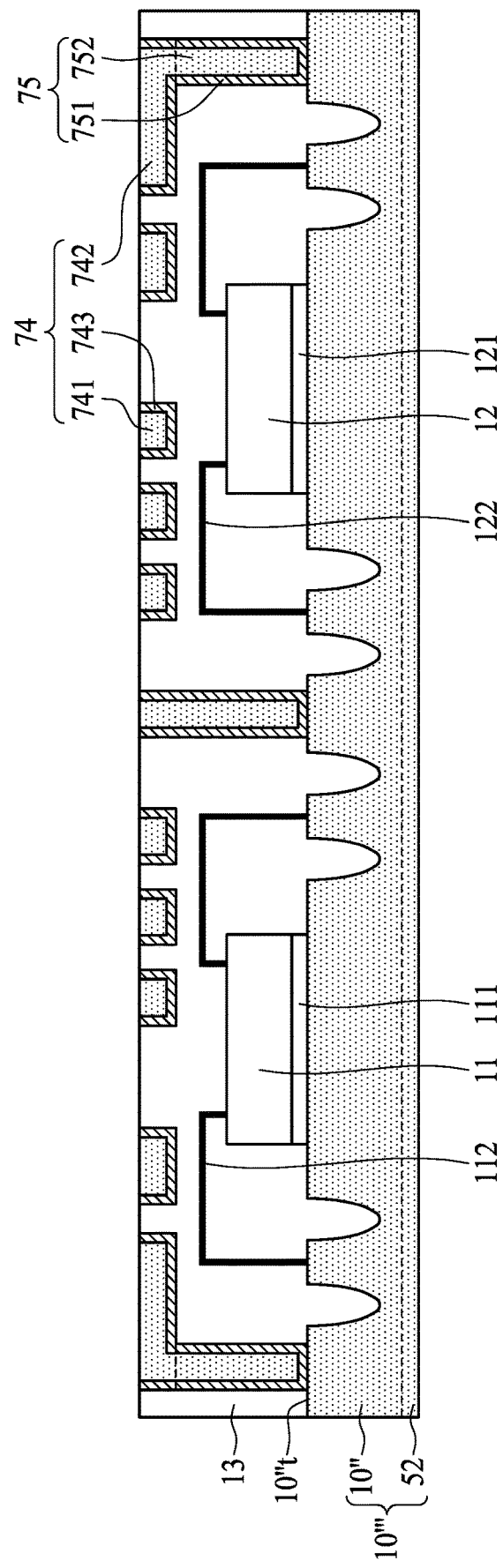

Referring to FIG. 10F, a portion of the seed layer 51 and the conductive layer 52 are removed by a grinding operation to form the patterned conductive layer 74. The patterned conductive layer 74 includes the conductive layers 741 and 742 and the seed layer 743. The conductive layer 741 may be a conductive pad. The conductive layer 742 may be a conductive trace. After the grinding operation, the top surfaces of the patterned conductive layer 74 and the encapsulant 13 may be substantially coplanar.

The interconnection element 75 includes the seed layer 751 and the conductive via 752. The seed layer 751 may include Ti, TiCu or other suitable materials. The conductive via 752 may include Cu or other suitable materials. The patterned conductive layer 74 is electrically connected to the etched carrier 10''' through the interconnection element 75. The interconnection element 75 and the patterned conductive layer 74 are formed simultaneously. The interconnection element 75 and the patterned conductive layer 74 are formed in one piece.

In some embodiments, the top surface of the patterned conductive layer 74 after grinding may be recessed from the top surface of the encapsulant 13 as a result of a flash etching operation following the grinding operation. The recess of the patterned conductive layer 74 due to the flash etching operation may appear as a dishing structure. Under this situation, the top surface of the patterned conductive layer 74 may be lower than the top surface of the encapsulant 13.

In some embodiments, a protection layer (not shown in FIG. 10F) with a conductive material may be formed on the top surface of the patterned conductive layer 74 by an electroplating operation, a spraying operation, or other suitable operations. The protection layer may include Ni, Au, Pd, alloy of the same, or other suitable materials.

Figure 10G:
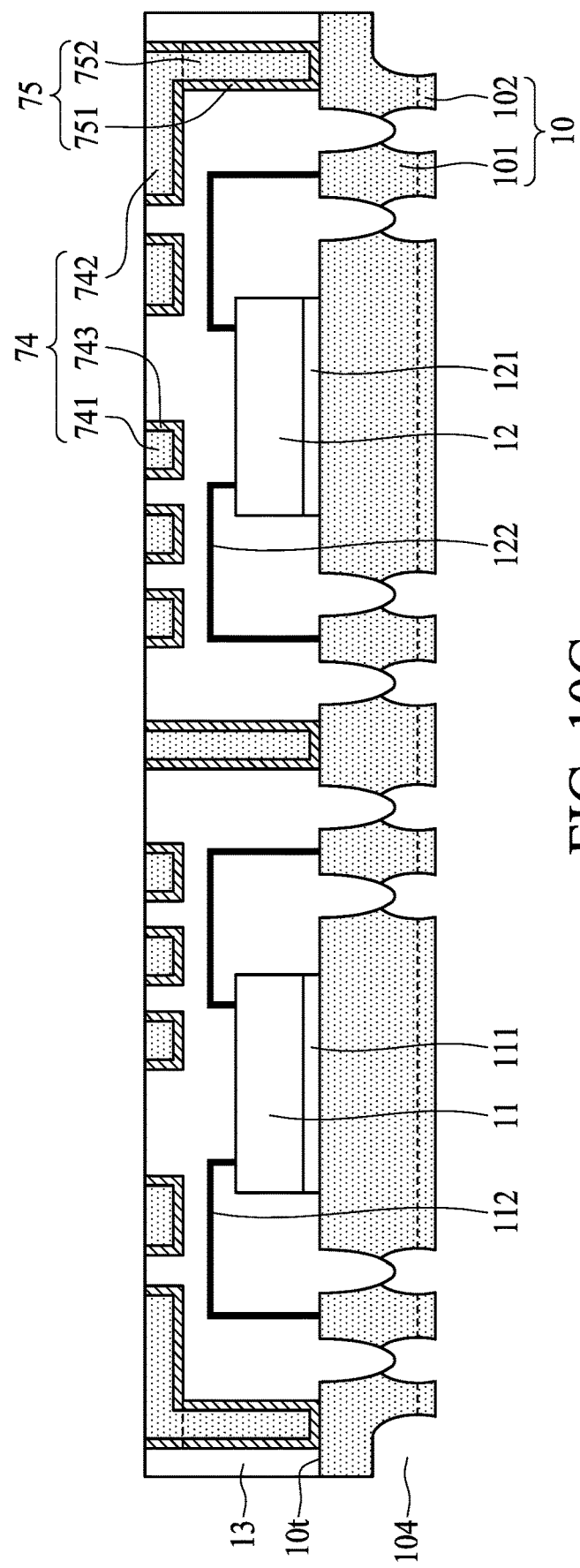

Referring to FIG. 10G, a half etching operation is performed on the carrier 10''', for example, on a backside of the carrier 10''', so that the backside of the carrier 10''' is patterned. After the backside half etching operation, a carrier 10 associated with two conductive layers 101 and 102 is obtained. The backside half etching operation of the carrier 10''' may be performed after the formation of the patterned conductive layer 74. The backside surface morphology or pattern of the carrier 10 may be controlled during the backside half etching operation. The carrier 10 includes a conductive layer 101 in proximity to the semiconductor devices 11, 12, and the encapsulant 13, and a conductive layer 102 opposite to the conductive layer 101. The recess 104 can be formed during the backside half etching operation to an extent that the encapsulant 13 is exposed from the carrier 10'''. In some embodiments, the recesses 104 may be designed to avoid positions under the projection of the semiconductor devices 11, 12. After the singulation operation of the semiconductor device package 7, as shown in FIG. 10G, the position of the recess 104 can be adjacent to a backside periphery of the singulated semiconductor device package.

Figure 10H:
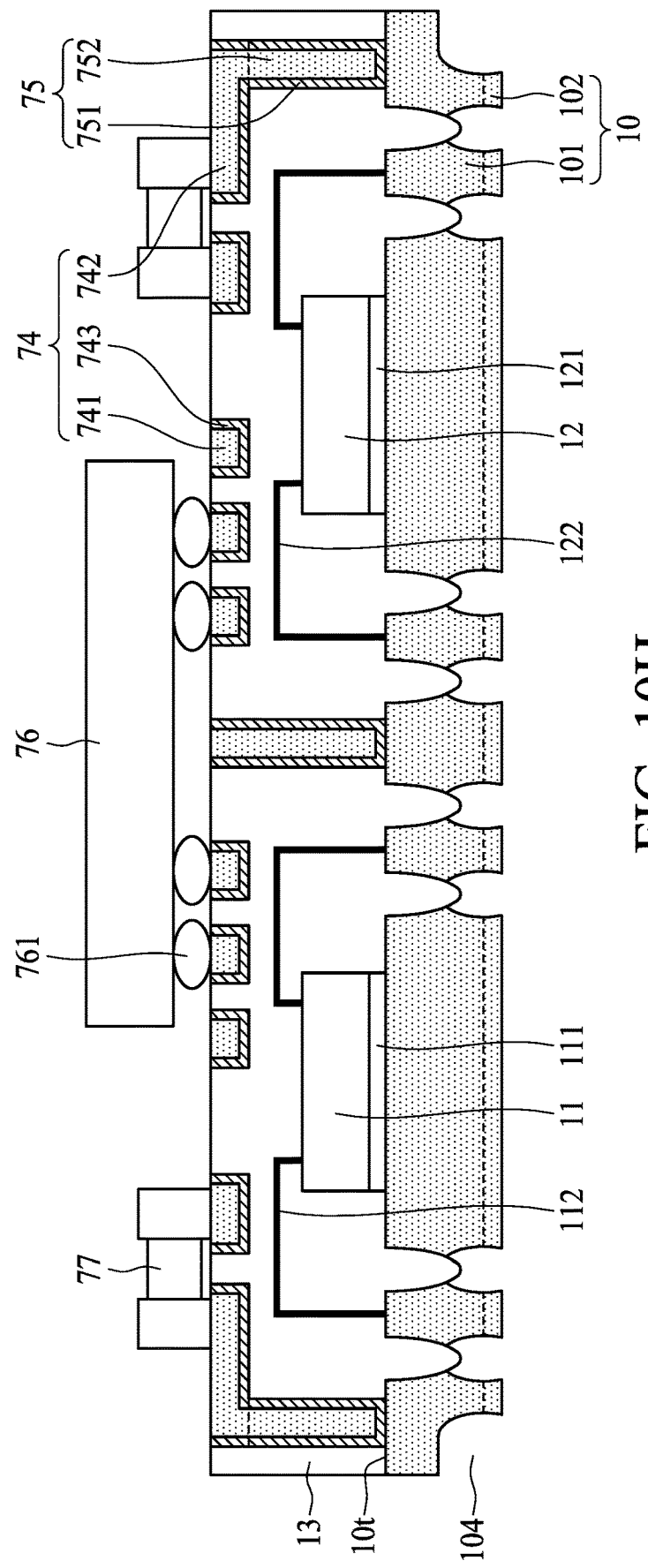

Referring to FIG. 10H, the semiconductor device 76 is disposed on the top surface 13t of the encapsulant 13. The semiconductor device 76 is electrically connected to the patterned conductive layer 74 through the conductive pad 761. The conductive pads 761 may be in contact with the conductive layer 741 and/or the conductive layer 742. The electronic component 77 is disposed on the top surface of the encapsulant 13. The electronic component 77 is electrically connected to the patterned conductive layer 74. The electronic component 77 may be in contact with the conductive layer 741 or the conductive layer 742. The electronic component 77 may be in contact with the conductive layers 741 and 742. In some embodiments, the semiconductor device 76 may include a chip. The semiconductor device 76 may include a wafer level chip scale package. The electronic component 77 may be a passive component (including, for example, a capacitor, a resistor, or an inductor). A singulation operation is performed to form the semiconductor device package 7.

FIG. 11A through FIG. 11I illustrate some embodiments of a method of manufacturing the semiconductor device package 8 according to some embodiments of the present disclosure. Various figures have been simplified to more clearly present aspects of the present disclosure.

The operations of FIG. 11A through FIG. 11F of manufacturing the semiconductor device package 8 may be similarly to those of manufacturing the semiconductor device package 7 of FIG. 10A through FIG. 10F.

Figure 11A:
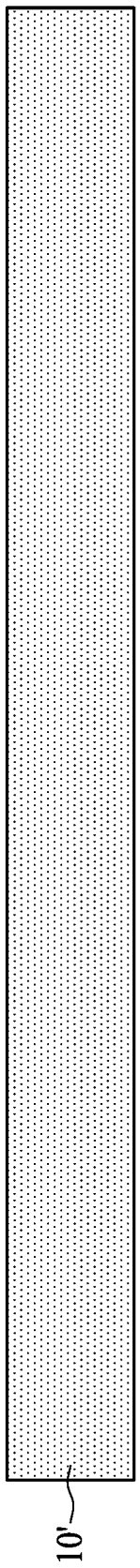
FIG. 11A, FIG. 11B, FIG. 11C, FIG. 11D, FIG. 11E, FIG. 11F, FIG. 11G, FIG. 11H, and FIG. 11I illustrate intermediate operations of a method for manufacturing a semiconductor device package according to some embodiments of the present disclosure.
Figure 11B:
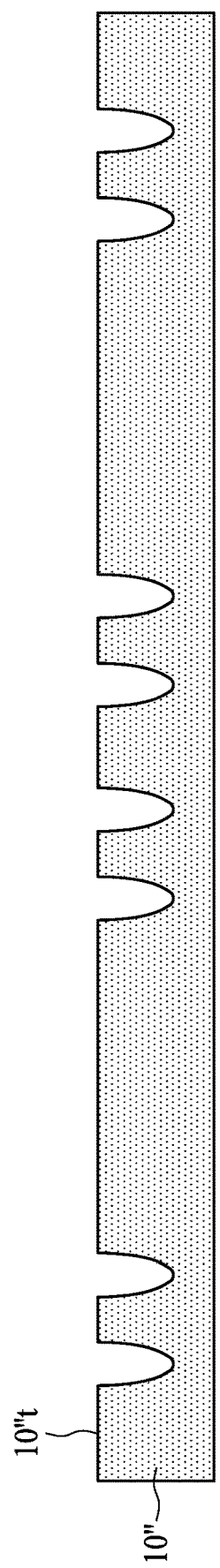
Figure 11C:
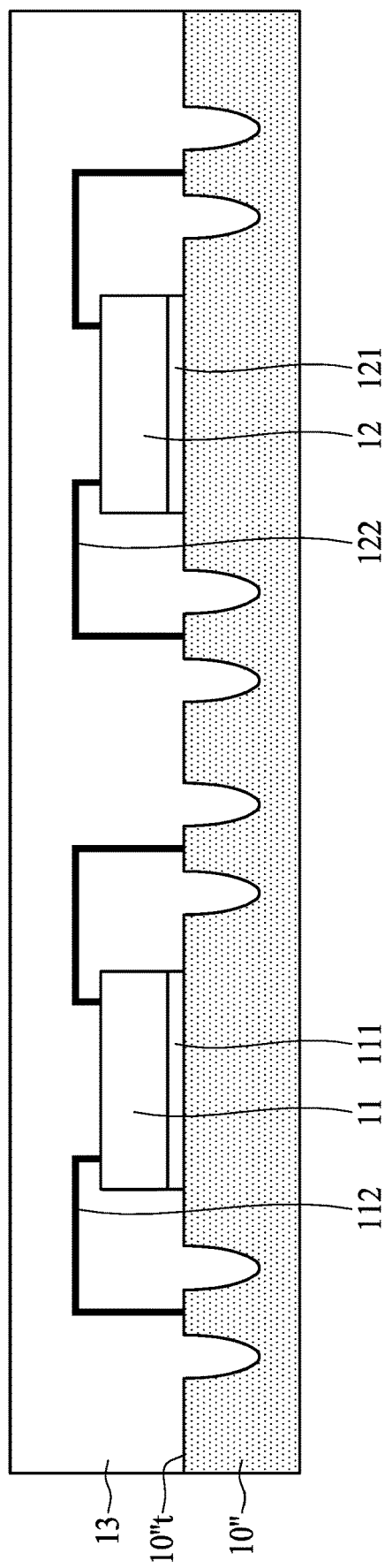
Figure 11D:
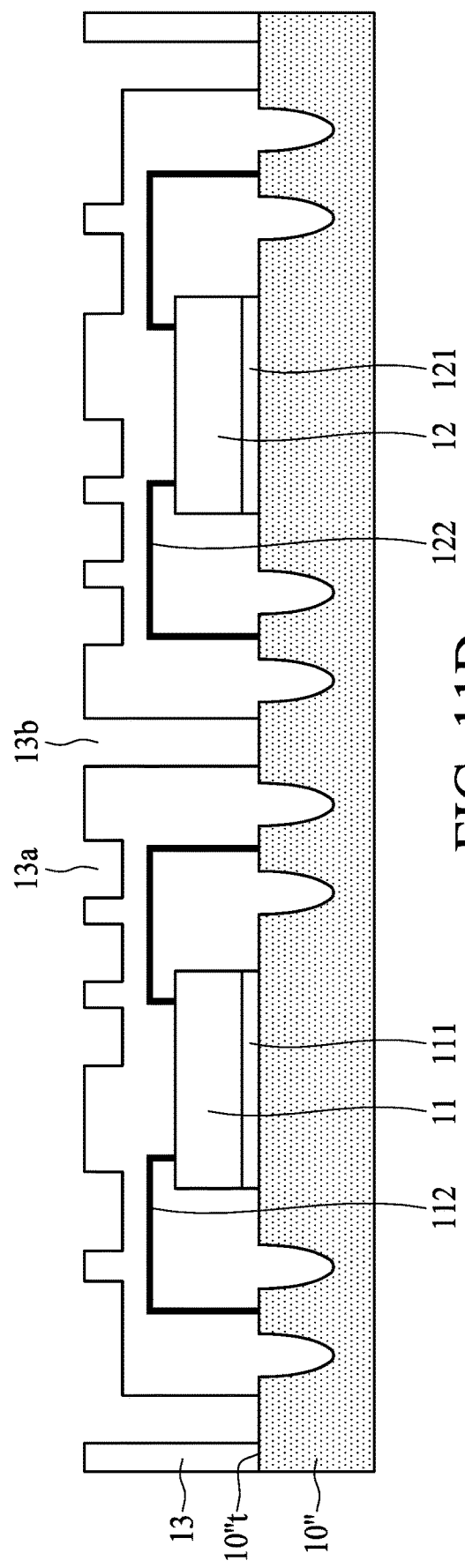
Figure 11E:
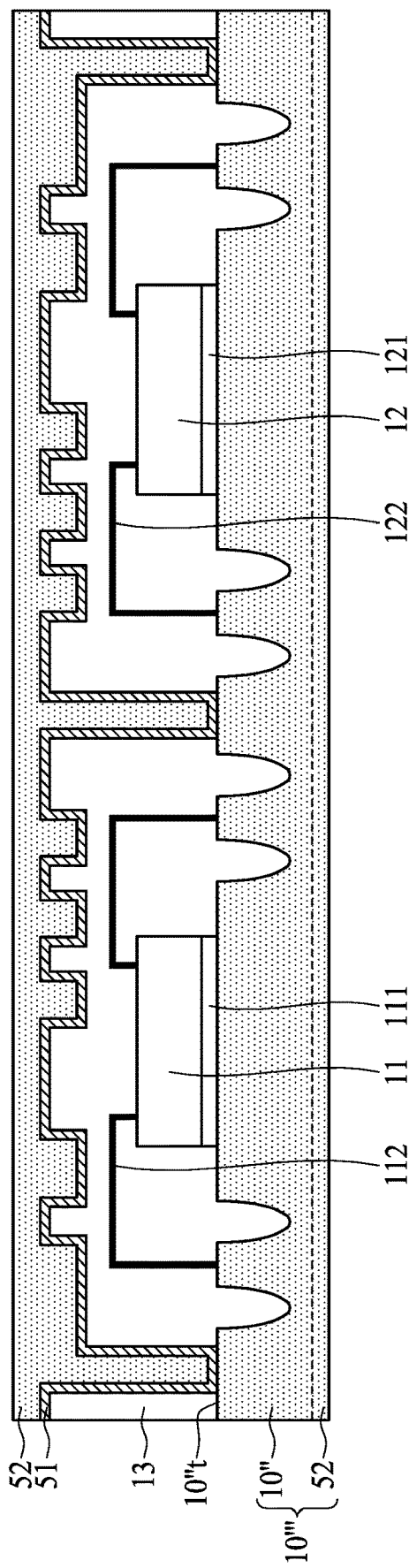
Figure 11F:
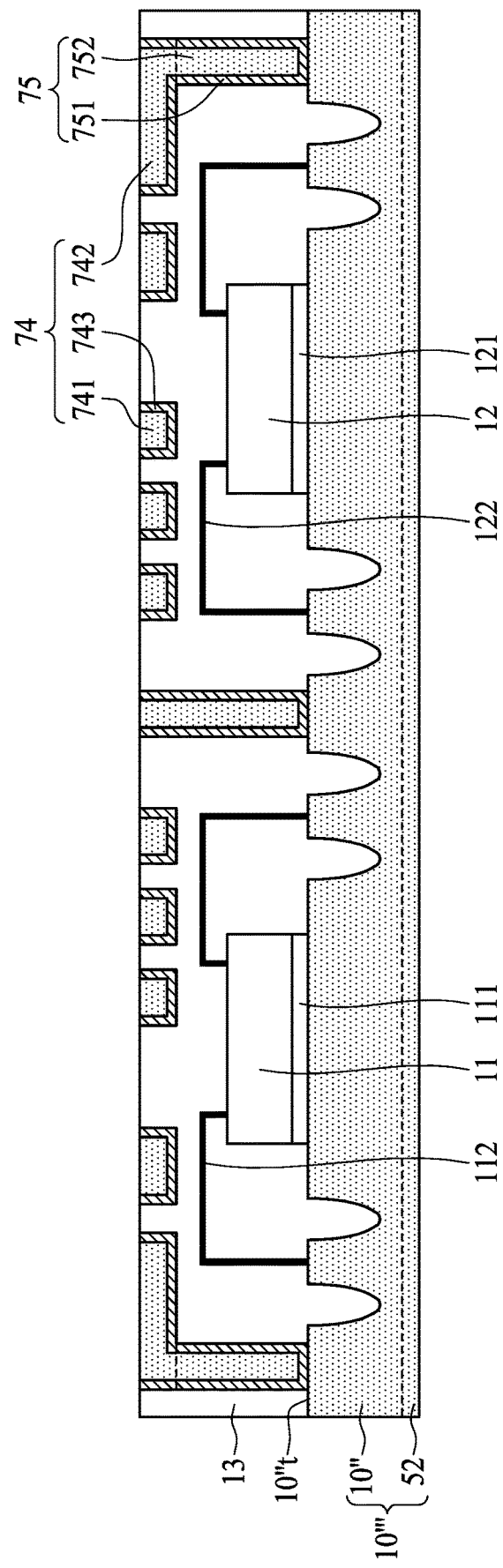
Figure 11G:
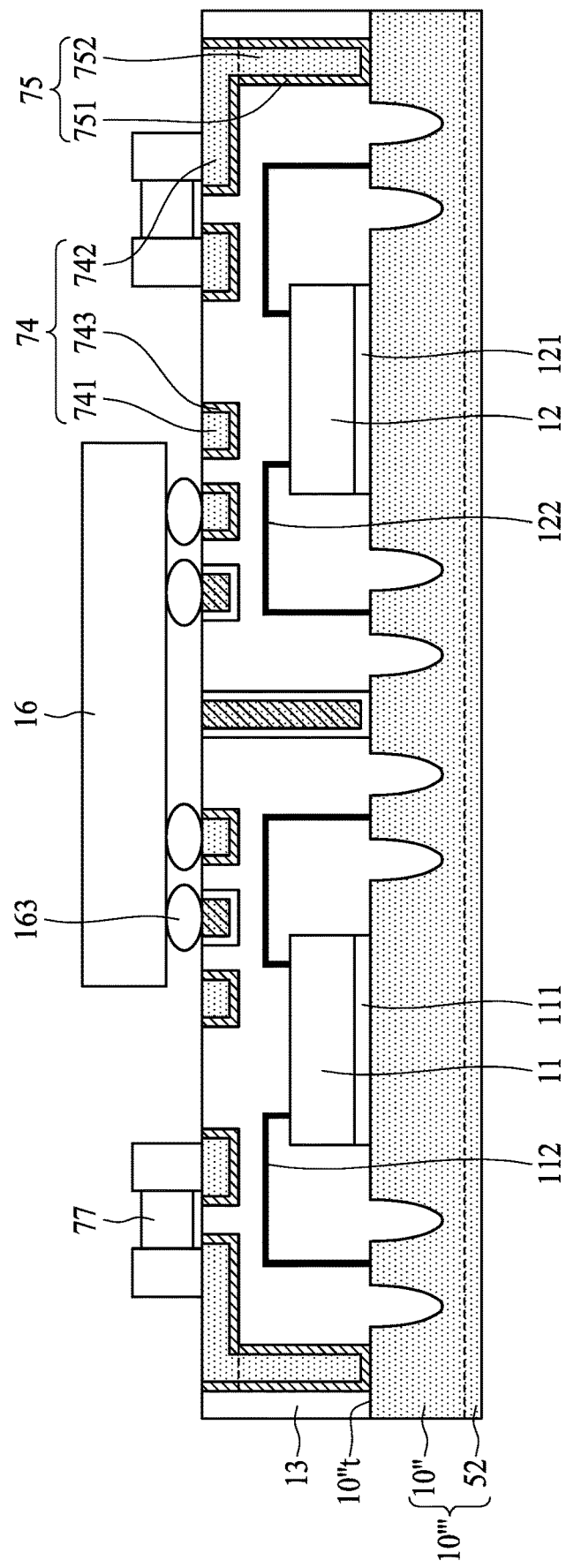

Referring to FIG. 11G, the operations of attachments of the semiconductor device 16 and the electrical component 77 of FIG. 11G are similar to that of FIG. 10H except that the semiconductor device 16 is different from the semiconductor device 76.

Figure 11H:
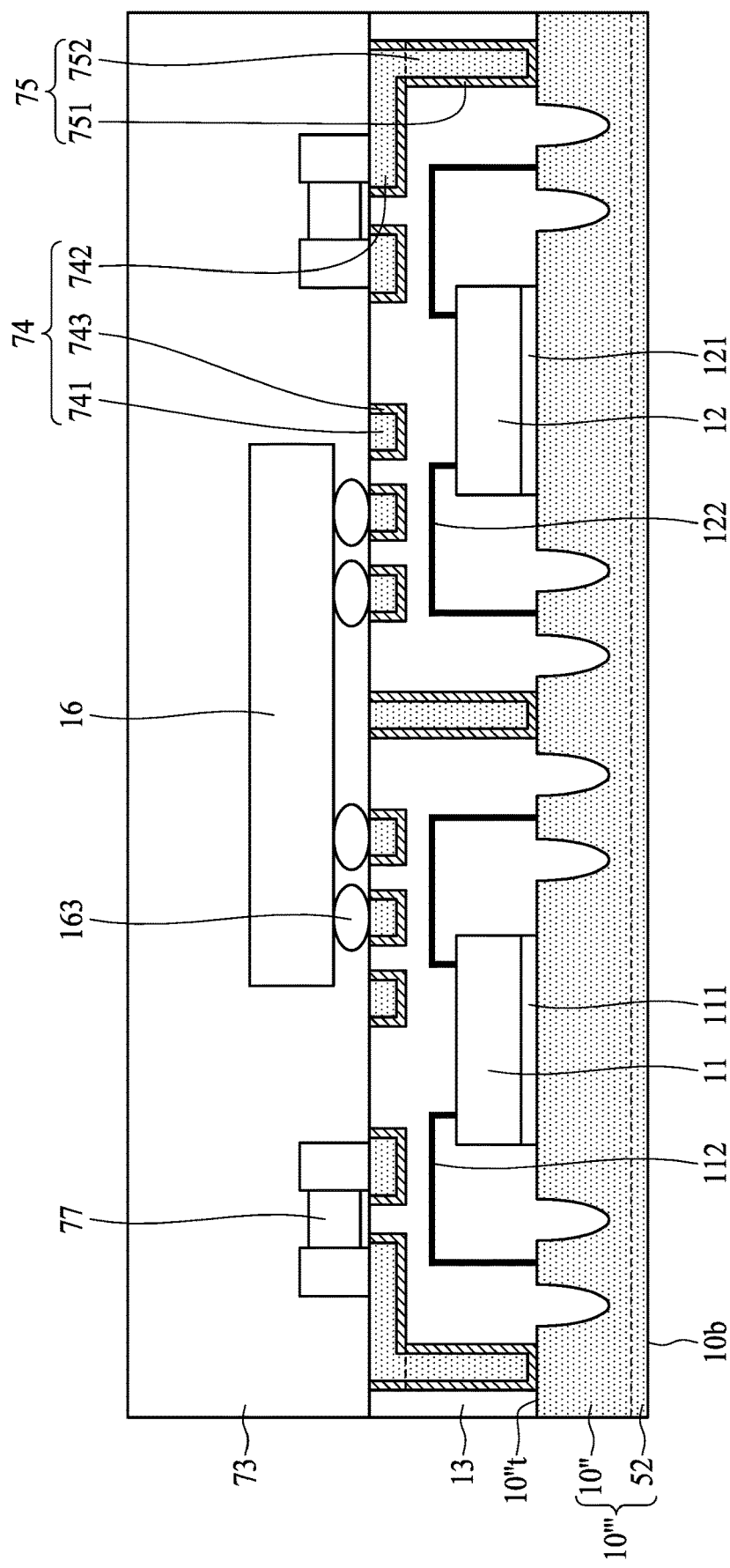

Referring to FIG. 11H, the encapsulant 73 is disposed on the top surface of the encapsulant 13. The encapsulant 73 encapsulates the semiconductor device 16 and the electrical component 77.

Figure 11I:
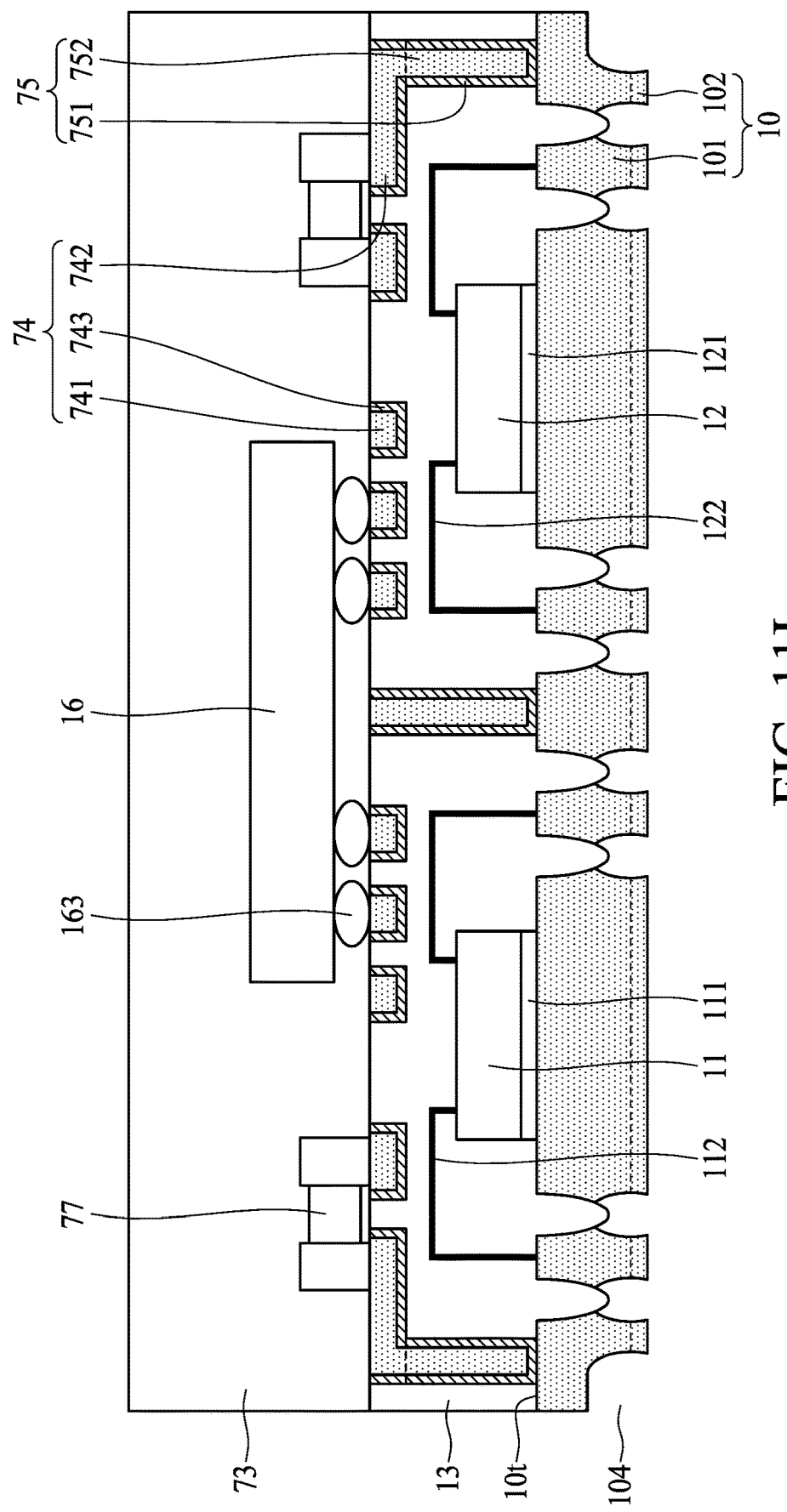

Referring to FIG. 11I, the etching operation of FIG. 11I is similar to that of FIG. 10G. For example, a half etching operation is performed on the carrier 10''' on a backside of the carrier 10''', so that the backside of the carrier 10''' is patterned. After the backside half etching operation, the carrier 10 associated with two conductive layers 101 and 102 is obtained. A singulation operation is performed to form the semiconductor device package 8.

FIG. 12A through FIG. 12J illustrate some embodiments of a method of manufacturing the semiconductor device package 9 according to some embodiments of the present disclosure. Various figures have been simplified to more clearly present aspects of the present disclosure.

The operations of FIG. 12A through FIG. 12F of manufacturing the semiconductor device package 9 may be similarly to those of manufacturing the semiconductor device package 7 of FIG. 10A through FIG. 10F.

Figure 12A:
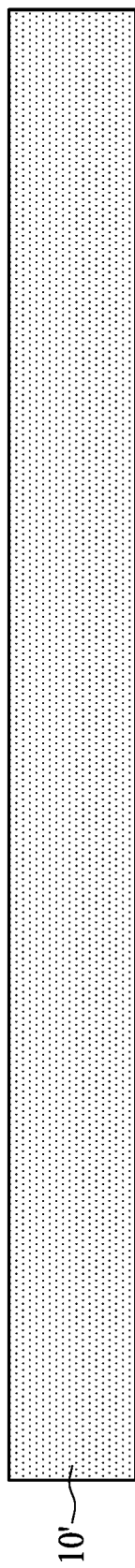
FIG. 12A, FIG. 12B, FIG. 12C, FIG. 12D, FIG. 12E, FIG. 12F, FIG. 12G, FIG. 12H, FIG. 12I, and FIG. 12J illustrate intermediate operations of a method for manufacturing a semiconductor device package according to some embodiments of the present disclosure.
Figure 12B:
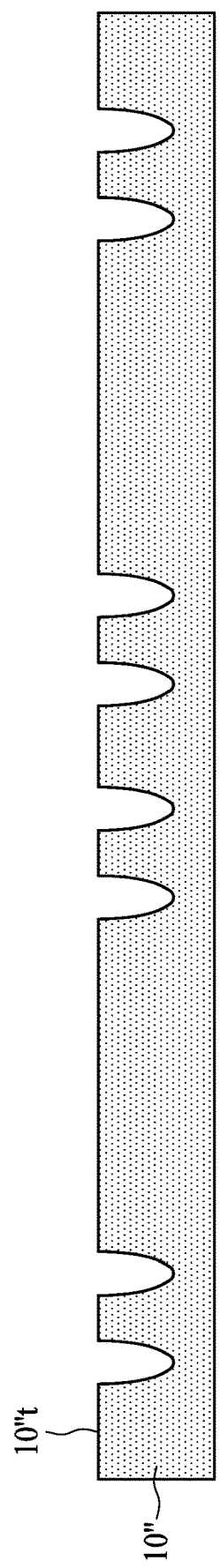
Figure 12C:
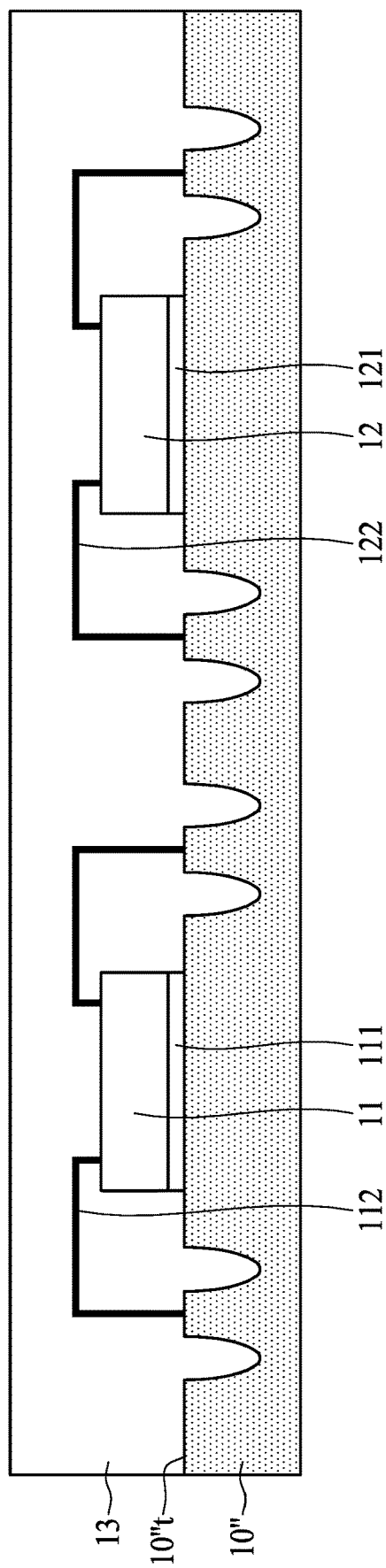
Figure 12D:
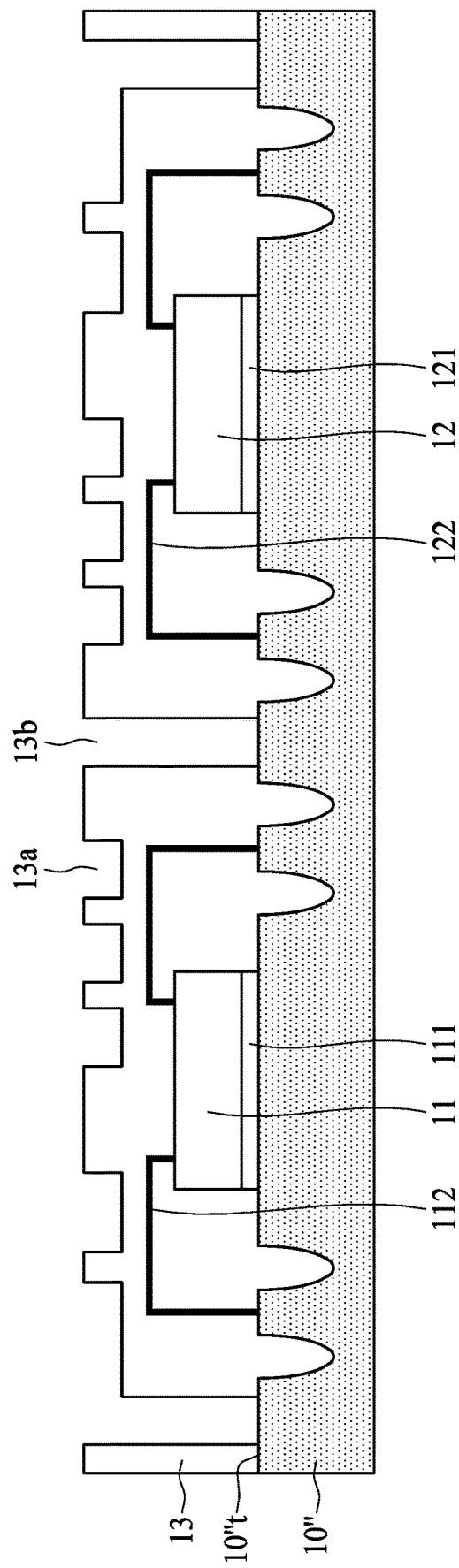
Figure 12E:
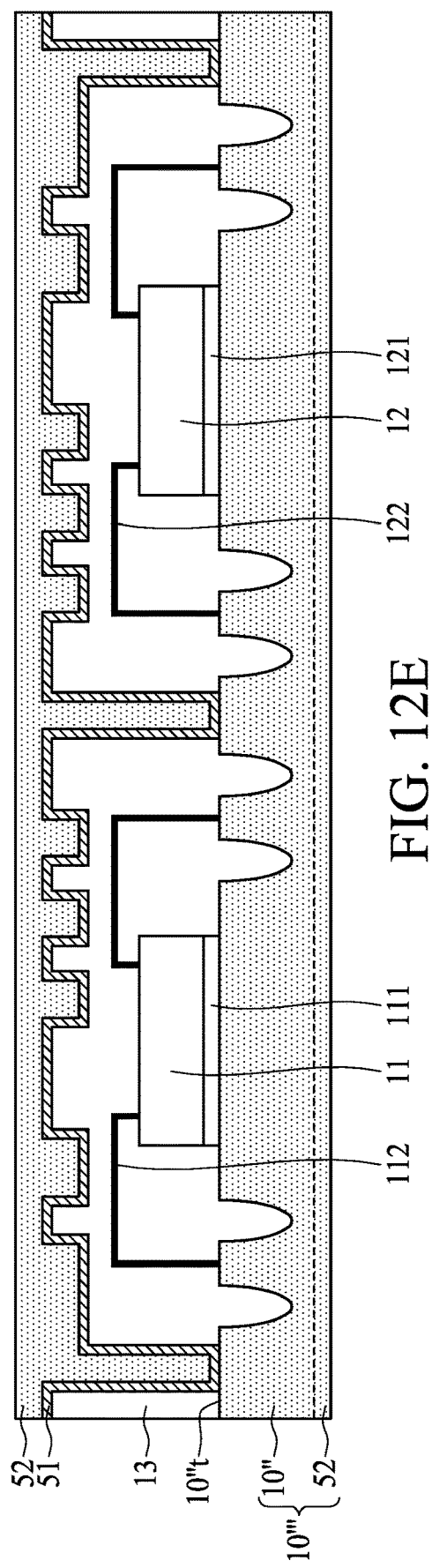
Figure 12F:
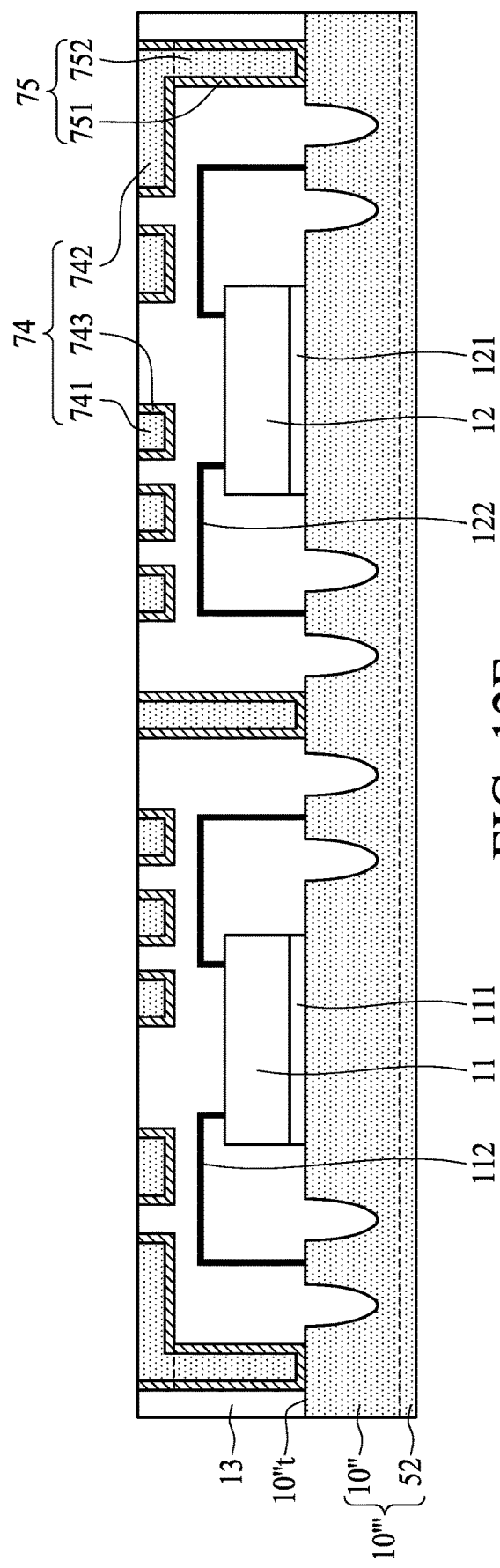
Figure 12G:
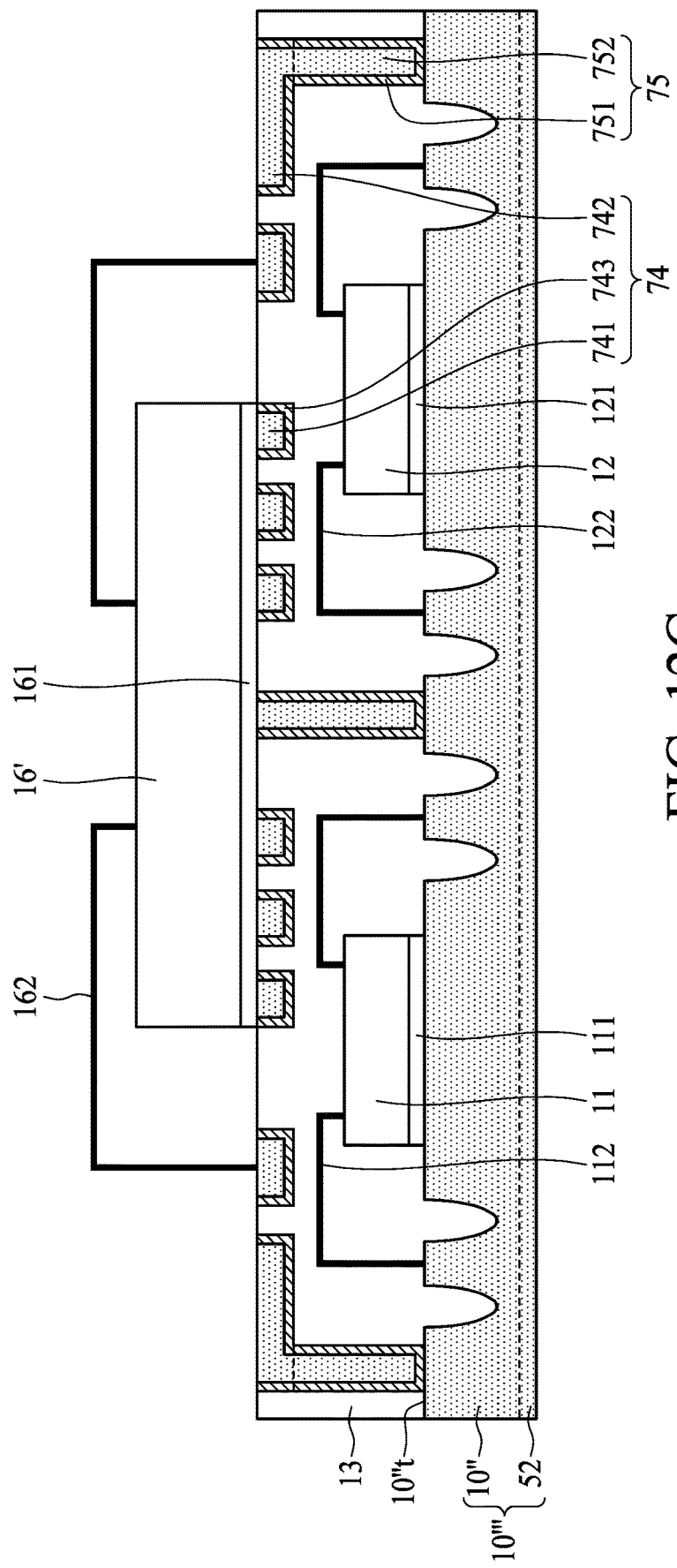

Referring to FIG. 12G, the operation of attachment of the semiconductor device 16' is similar to that of attachment of the semiconductor device 11 or 12 except that the semiconductor device 16' is disposed on the encapsulant 13. The semiconductor device 16' is wire-bonded to the patterned conductive layer 74 through the conductive wire 162. The conductive wire 162 may be electrically connected to the conductive layer 741 or the conductive layer 742. The adhesive 161 is disposed between the encapsulant 13 and the semiconductor device 16'.

Figure 12H:
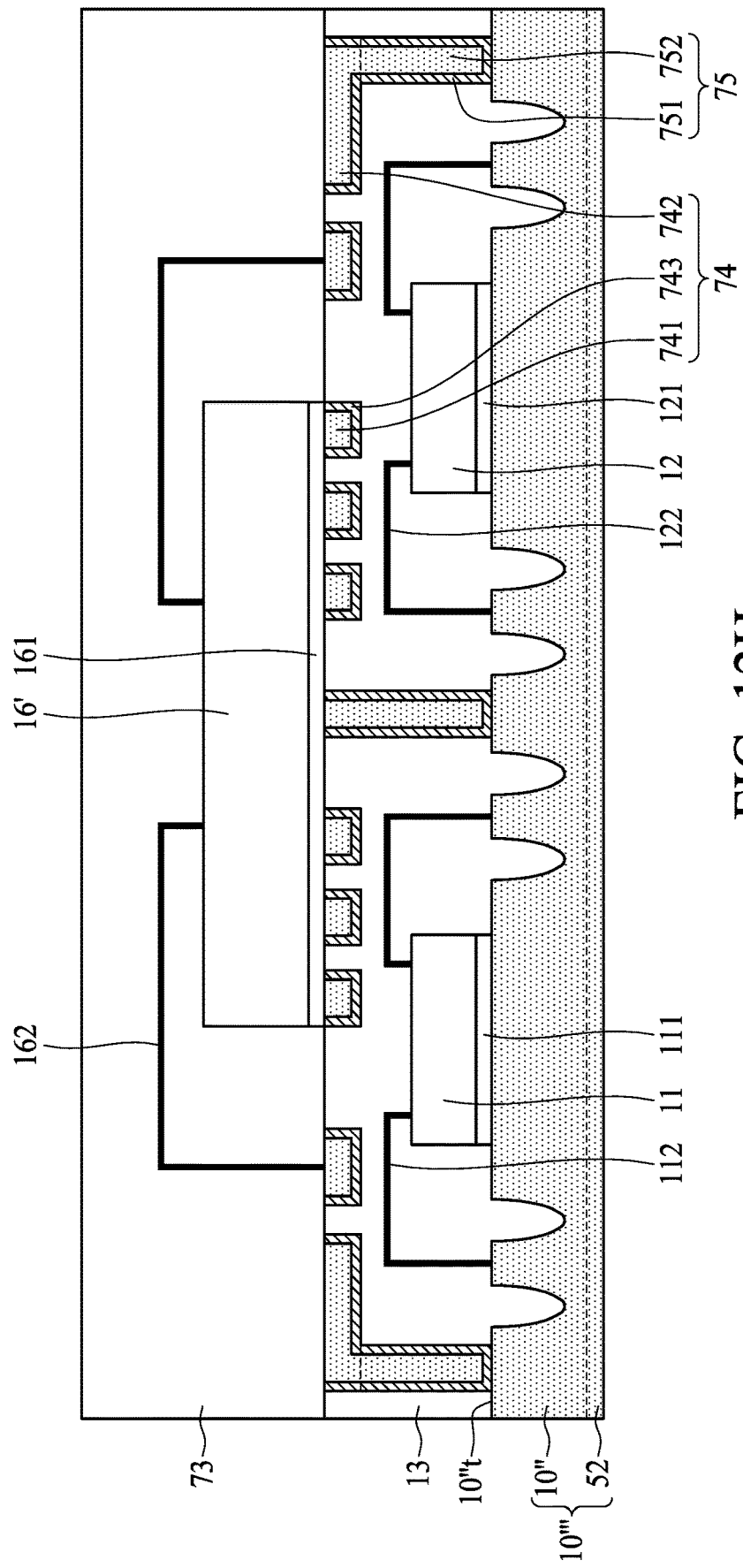

Referring to FIG. 12H, the encapsulant 73 is disposed on the top surface of the encapsulant 13. The encapsulant 73 encapsulates the semiconductor device 16'.

Figure 12I:
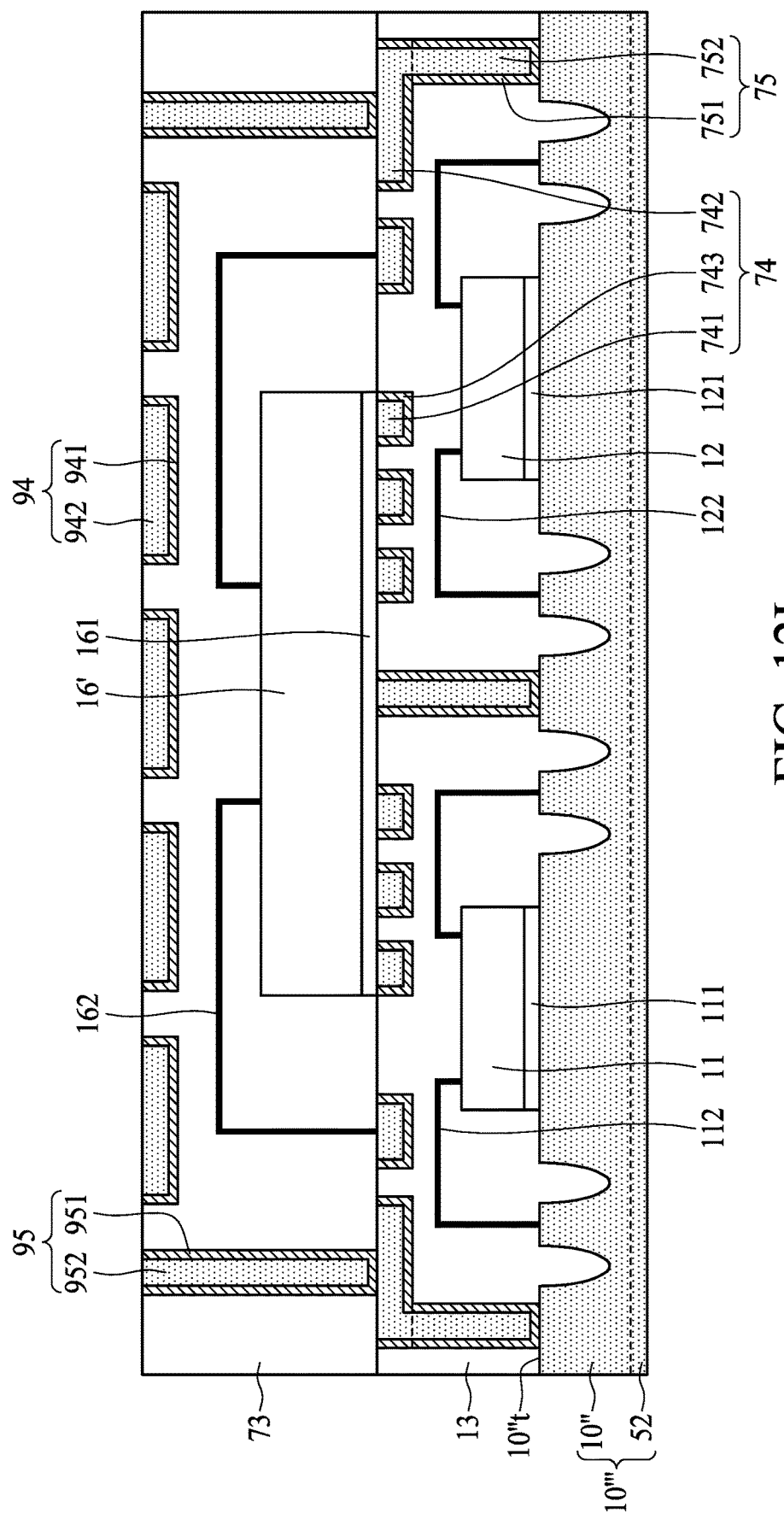

Referring to FIG. 12I, the formations of the antenna 94 and the shielding layer 95 are similar to the formations of the antenna 14 and the shielding layer 15 of FIG. 5D through FIG. 5F. The configuration, the functions, and the materials of the antenna 94 are similar to those of the antenna 14 of FIG. 1A. The antenna 94 includes a seed layer 941 and a conductive layer 942. The configuration, the functions, and the materials of the shielding layer 95 are similar to those of the shielding layer 15 of FIG. 1A. The shielding layer 95 includes the seed layer 951 and the conductive layer 952.

Figure 12J:
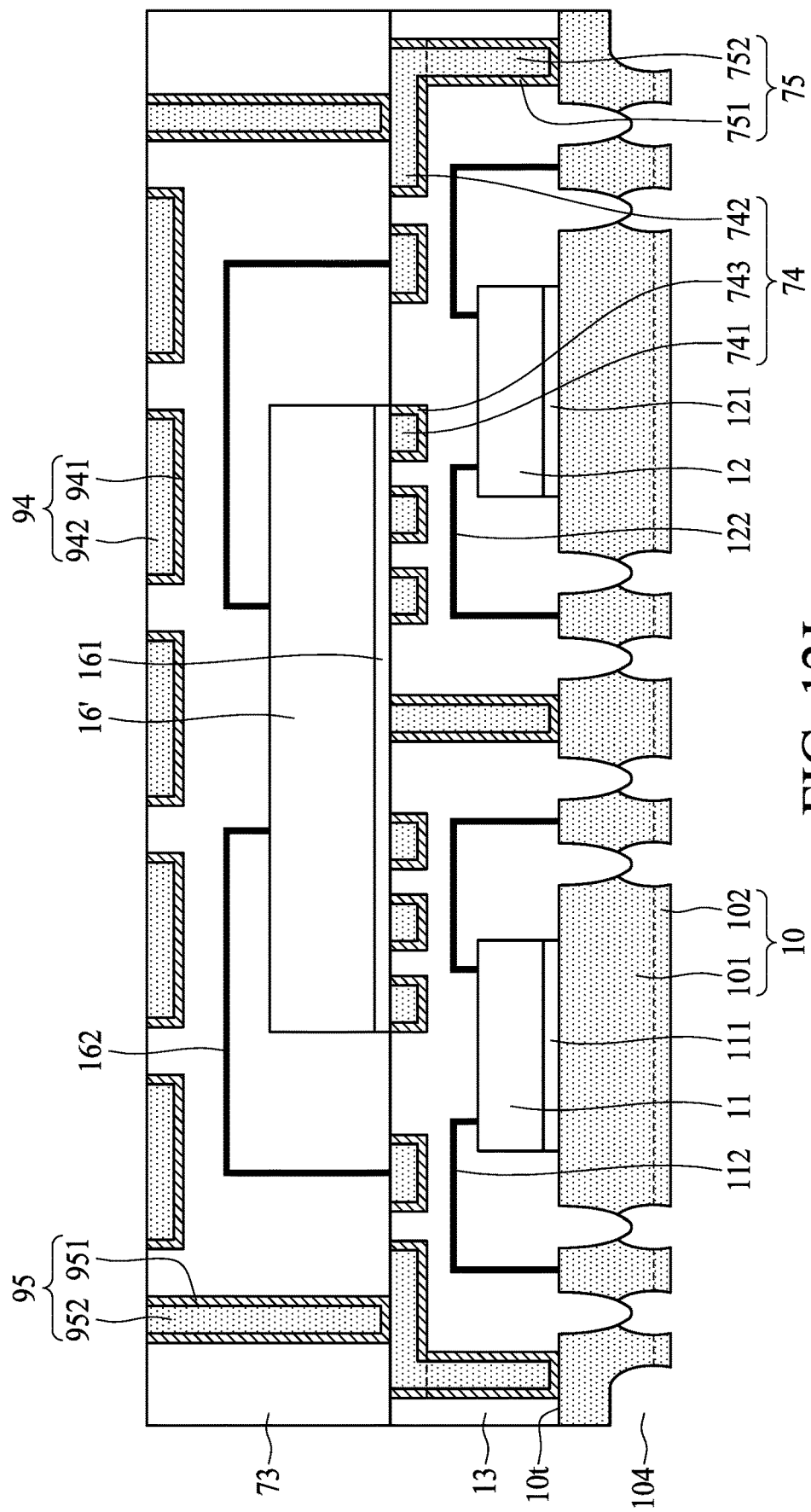

Referring to FIG. 12J, the etching operation of FIG. 12J is similar to that of FIG. 10G. For example, a half etching operation is performed on the carrier 10''' on a backside of the carrier 10''', so that the backside of the carrier 10''' is patterned. After the backside half etching operation, the carrier 10 associated with two conductive layers 101 and 102 is obtained. A singulation operation is performed to form the semiconductor device package 9. In some embodiments, the half etching operation illustrated in FIG. 12J is performed after the formation of the antenna 94 and the shielding layer 95. In some comparative embodiments where the half etching operation illustrated in FIG. 12J is performed prior to the formation of the antenna 94 and the shielding layer 95, the exposed encapsulant 73 at the backside of the carrier 10''' may be further deposited with conductive materials during the antenna and shielding layer formation and causing undesired short in the semiconductor package structure.

As used herein, spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
a carrier having a first surface and a second surface opposite to the first surface;
an encapsulant disposed on the first surface of the carrier; and
an antenna disposed on the encapsulant, the antenna including a seed layer and a conductive layer.

2. The semiconductor device package of claim 1, wherein the conductive layer is separated from the encapsulant by the seed layer.

3. The semiconductor device package of claim 1, wherein an upper surface of the antenna is lower than an upper surface of the encapsulant.

4. The semiconductor device package of claim 1, further comprising a shielding layer disposed on the first surface of the carrier.

5. The semiconductor device package of claim 4, wherein the shielding layer includes a seed layer and a conductive layer.

6. The semiconductor device package of claim 4, wherein the encapsulant encapsulates the antenna and the shielding layer.

7. The semiconductor device package of claim 1, wherein the antenna further comprises a protection layer disposed on the seed layer and the conductive layer.

8. The semiconductor device package of claim 1, wherein the carrier includes a first conductive layer proximal to the encapsulant and a second conductive layer proximal to the second surface.

9. The semiconductor device package of claim 8, wherein the carrier further includes a seed layer, and wherein the seed layer is disposed between the first conductive layer and the second conductive layer.

10. The semiconductor device package of claim 1, wherein the carrier comprises a quad flat no lead (QFN) structure.

11. A semiconductor device package, comprising:
a carrier having a first surface and a second surface opposite to the first surface, the carrier including a first layer proximal to the first surface and a second layer proximal to the second surface, the second layer including a bi-layer; and
an encapsulant disposed on the first surface of the carrier,
an antenna disposed on the encapsulant, the antenna including a seed layer and a conductive layer,
wherein a material of one of the seed layer and the conductive layer of the antenna is the same as a material of one of the bi-layer of the second layer.

12. The semiconductor device package of claim 11, wherein a conductive substance in the second layer is greater in content than the conductive substance in the first layer.

13. The semiconductor device package of claim 11, wherein the antenna is disposed in a trench on a surface of the encapsulant.

14. The semiconductor device package of claim 13, wherein one of the bi-layer comprises material substantially identical to the seed layer.

15. The semiconductor device package of claim 11, further comprising a shielding layer disposed on the first surface of the carrier.

16. The semiconductor device package of claim 15, wherein the shielding layer includes a seed layer and a conductive layer.

17. The semiconductor device package of claim 15, wherein the shielding layer surrounds the antenna.

18. A method of manufacturing a semiconductor package device, comprising:
   providing a carrier including a first patterned layer proximal to a first surface of the carrier;
   encapsulating the carrier by an encapsulant;
   forming trenches in the encapsulant;
   forming a conductive layer in the trenches and on the carrier; and
   subsequent to forming the conductive layer in the trenches and on the carrier, forming a second patterned layer proximal to a second surface of the carrier, the second surface being opposite to the first surface.

19. The method of claim 18, wherein prior to forming the conductive layer in the trenches and on the carrier, forming a seed layer in the trenches.

20. The method of claim 18, wherein the conductive layer is formed by an electroplated operation.

21. The method of claim 19, wherein the conductive layer and the seed layer is grinded to form an antenna.

22. The method of claim 19, wherein the conductive layer and the seed layer is grinded to form a shielding layer.

23. The method of claim 18, wherein forming the conductive layer on the carrier comprises electroplating the conductive layer proximal to the second surface of the carrier.

24. The method of claim 23, wherein electroplating the conductive layer proximal to the second surface of the carrier is performed concurrently with the formation of an antenna.

25. The method of claim 23, wherein electroplating the conductive layer proximal to the second surface of the carrier is performed concurrently with the formation of a shielding layer.

26. The method of claim 18, further comprising disposing at least one semiconductor device on the carrier prior to encapsulating the carrier.

27. The method of claim 18, wherein forming the trenches further comprises forming a first trench with a first trench depth from a top surface of the encapsulant and forming a second trench with a second trench depth in the encapsulant, wherein the second trench depth is greater than the first trench depth.

28. The method of claim 18, wherein the first patterned layer is formed by a half etching operation.

29. The method of claim 18, wherein the second patterned layer is formed by a half etching operation.

30. A semiconductor device package, comprising:
   a carrier;
   a first semiconductor device disposed on the carrier;
   a first encapsulant disposed on the carrier, the first encapsulant encapsulating the first semiconductor device and the carrier;
   a patterned conductive layer embedded in the first encapsulant, the patterned conductive layer including a top surface exposed from the first encapsulant; and
   a second encapsulant disposed on the first encapsulant.

31. The semiconductor device package of claim 30, further comprising an antenna disposed on the second encapsulant, the antenna including a seed layer and a conductive layer.

32. The semiconductor device package of claim 31, further comprising a shielding layer disposed on the patterned conductive layer, wherein the shielding layer includes a seed layer and a conductive layer.

33. The semiconductor device package of claim 32, further comprising a second semiconductor device disposed on the first encapsulant and electrically connected to the patterned conductive layer.

34. The semiconductor device package of claim 33, wherein the second semiconductor device, the antenna, the shielding layer are encapsulated by the second encapsulant, and wherein a top surface of the antenna and a top surface of the shielding layer are exposed by the second encapsulant.

35. The semiconductor device package of claim 30, wherein the patterned conductive layer comprises a seed layer.

36. The semiconductor device package of claim 35, wherein the patterned conductive layer comprises a conductive pad and a conductive trace.

37. The semiconductor device package of claim 30, wherein the patterned conductive layer comprises an antenna.

38. A method of manufacturing a semiconductor package device, comprising:
   providing a carrier;
   encapsulating the carrier by an encapsulant;
   forming a recess in the encapsulant;
   forming a conductive layer in the recess and onto a top surface of the encapsulant; and
   removing a portion of the conductive layer on the top surface of the encapsulant.

39. The method of claim 38, wherein removing the portion of the conductive layer is performed until a top surface of the conductive layer is not higher than the top surface of the encapsulant.

40. The method of claim 38, further comprising attaching at least one semiconductor device on the carrier and encapsulating the semiconductor device by the encapsulant.

41. The method of claim 38, wherein the recess is formed by laser ablation.

42. The method of claim 38, wherein removing the portion of the conductive layer includes a grinding operation.

43. The method of claim 38, wherein forming the conductive layer in the recess and onto the top surface of the encapsulant includes a sputtering operation.

44. The semiconductor device package of claim 1, wherein a portion of the encapsulant is exposed by the second surface of the carrier.

45. The semiconductor device package of claim 1, wherein the carrier is a lead frame.

* * * * *